United States Patent [19]

Jamal

[11] Patent Number: 5,572,712
[45] Date of Patent: Nov. 5, 1996

[54] METHOD AND APPARATUS FOR MAKING INTEGRATED CIRCUITS WITH BUILT-IN SELF-TEST

[75] Inventor: Kamran Jamal, Sunnyvale, Calif.

[73] Assignee: VLSI Technology, Inc., San Jose, Calif.

[21] Appl. No.: 315,460

[22] Filed: Sep. 30, 1994

[51] Int. Cl.$^6$ .................................................. G06F 17/00
[52] U.S. Cl. ..................... 395/500; 364/488; 364/490; 364/489; 371/22.6; 371/22.5
[58] Field of Search .......................... 395/500; 364/488, 364/489, 490, 491, 578; 371/22.1, 22.3, 22.5, 22.6, 27; 324/158.1, 763

[56] References Cited

U.S. PATENT DOCUMENTS

| | | | |
|---|---|---|---|
| 4,937,765 | 6/1990 | Shupe et al. | 364/570 |
| 5,197,016 | 3/1993 | Sugimoto et al. | 364/490 |
| 5,258,986 | 11/1993 | Zerbe | 371/21.2 |
| 5,282,146 | 1/1994 | Aihara et al. | 364/489 |
| 5,404,359 | 4/1995 | Gillenwater et al. | 371/22.5 |
| 5,485,467 | 1/1996 | Golnabi | 371/22.5 |
| 5,491,640 | 2/1996 | Sharma et al. | 364/488 |

OTHER PUBLICATIONS

Kamran Jamal, "Synthesis of High Performance BIST Structures for Embedded RAMs, ROMs, and Multipliers", Trade Media, Ltd., Oct. 1, 1994, pp. 295–303.
Bardell, Jr. et al., "Built–In Test for RAMs", IEEE 1998, pp. 29–37 Aug. 1988.
Beenker et al., "A Testability Strategy for Silicon Compilers", IEEE 1989, pp. 660–669 Jan. 1989.
Ferrira et al., "BIST for 1149.1–Compatible Boards: A Low–Cost and Maximum–Flexibility Solution", IEEE 1993, pp. 563–543 Aug. 1993
Kim et al., "Automatic Insertion of BIST Hardware Using VHDL", IEEE 1988, pp. 9–15 Mar. 1988.
Murzyn et al., "Integrating Verification Testing and Logic Synthesis", IEEE 1991, pp. 322–326 Mar. 1991.

*Primary Examiner*—Kevin J. Teska
*Assistant Examiner*—Tan Nguyen
*Attorney, Agent, or Firm*—Hickman, Beyer & Weaver, LLP

[57] ABSTRACT

A behavioral synthesis method for making integrated circuits with built-in self-test (BIST). Base specifications describing base functionality and BIST specifications describing BIST functionality are developed. The base specifications are described in a hardware description language (HDL) to create a base HDL which is input into a digital computer system. Utilizing both the base specifications and the BIST specifications, a BIST HDL is created on the digital computer system. A netlist is synthesized on the computer system from both the base HDL and the BIST HDL. Thereafter, a digital integrated circuit is produced as specified by the netlist. An advantage of the present invention is the description of BIST circuitry at the HDL level of abstraction instead of at the netlist level. By automatically generating BIST HDL given BIST specifications and base circuit specifications, a circuit designer is relieved of the complications of gate level manipulations to insert a BIST description into a netlist. Compared with the intricacies of low level netlist descriptions, the highest possible abstraction level—synthesizable behavioral HDL—is easy for designers to understand. This highest level HDL is technology independent and easily modifiable.

37 Claims, 10 Drawing Sheets

| name | value | default | type | range |
|---|---|---|---|---|
| BISTRAM_ram_pcl_file | ram_data | cram01_1 | string | |
| BISTRAM_analysis | signature compare | signature | string | |
| BISTRAM_test_result | flag scan signature | flag | string | |
| BISTRAM_init_pin | true false | false | boolean | |
| BISTRAM_schematic | true false | false | boolean | |
| Sim_Option | netlist | netlist | string | |
| Layout_Option | portable | portable | string | |

*Fig. 6a*

| \multicolumn{5}{c}{ram_data parameters.} | | | | |
|---|---|---|---|---|
| accept | | | | |
| name | value | default | type | range |
| RS2_WORD_LENGTH | 8 | 8 | integer | [4:32] |
| RS2_WORD_DEPTH | 64 | 64 | integer | [64:4096] |
| RS2_IO_SEPARATE | true false | true | boolean | |
| RS2_AS_SEPARATE | true false | false | boolean | |
| RS2_OE_PROVIDE | YES NO VSS | YES | string | |
| RS2_DS_SEPARATE | YES NO VDD | NO | string | |
| RS2_WS_SEPARATE | YES NO VDD | NO | string | |
| Sim_Option | vlsiModel netlist | netlist | string | |
| Layout_Option | optimized | optimized | string | |
| HDL_Option | behavioral | behavioral | string | |
| Compatible_Tag | VCC450L VSC450 VSC450L VSC470 VSC | vsc450 | string | |

Fig. 6b

METHOD AND APPARATUS FOR MAKING INTEGRATED CIRCUITS WITH BUILT-IN SELF-TEST

BACKGROUND OF THE INVENTION

This invention relates generally to integrated circuit design and more particularly to automated integrated circuit design by behavioral synthesis.

Over the past several decades, integrated circuits (ICs) have become an integral part of many devices and machines. Custom or semi-custom ICs are often favored over off-the-shelf components for such devices and machines and are often called "Application Specific Integrated Circuits" or "ASICs." To facilitate ASIC design and fabrication under application specific performance requirements or constraints, automated design and manufacturing systems for ASICs have been developed.

A "behavioral synthesis system" is a computer aided design (CAD) system. With such a system, the ASIC inputs, outputs and other parameters are expressed in a hardware description language (HDL) and input into a computer. Behavioral synthesis software then designs a circuit meeting these parameters.

Typically, behavioral synthesis IC design and manufacturing processes begin by describing certain performance or structural constraints in an HDL such as VHDL or VERILOG. Both these HDLs are available in several commercial forms. The HDL description can be processed or "synthesized" to form a "net" or "netlist" specifying components and their interconnections meeting circuit parameters.

It is always desirable to test the integrated circuit after construction. RAMs, ROMs, and multipliers are common test targets, but they may be deeply embedded within the IC logic. Multiplexer or "functional block" isolation is one approach to testing these subcircuits. In this technique, multiplexers synthesize paths from IC input/output (I/O) pads to the targeted subcircuit. Externally generated test enable signals switch the multiplexers into test mode. Functional block isolation suffers the disadvantages of multiplexer delays, routing congestion, and the need for externally generated test vectors or signals. Also, for a limited number of I/O pads, designing a multiplexer configuration to test all the targeted embedded subcircuits may be difficult.

Alternatively, built-in self-test (BIST) circuitry may be fabricated on the integrated circuit itself. BIST logic generates input test patterns for the RAMs, ROMs, or multipliers. The test output data from these subcircuits can either be compared with the input from the BIST directly or compacted. The comparison result is stored in a register and then shifted out of the IC to an external measurement device. In this way, the external measurement device only detects whether a logic fault was found and does not perform signal comparisons.

To implement the BIST circuitry on the IC via behavioral synthesis, it must be described in the netlist once the RAMs, ROMs, and multipliers have been specified. Modifying the netlist directly after the subcircuits have been described is a very difficult and time-consuming process since the BIST must be described at the gate level. Therefore, given the subcircuit specifications, describing the BIST circuitry in an HDL before synthesis of the netlist would be advantageous.

SUMMARY OF THE INVENTION

The present invention involves a method for making digital integrated circuits with built-in self-test (BIST). The method includes developing circuit specifications including base specifications describing base functionality and BIST specifications describing BIST functionality. The base specifications are described in a hardware description language to create a base HDL, and the base HDL is input into a digital computer system. Utilizing both the base specifications and the BIST specifications, a BIST HDL is created on the digital computer system. A netlist is synthesized on the computer system from both the base HDL and the BIST HDL. Thereafter, a digital integrated circuit is produced as specified by the netlist.

A method for creating an HDL description of BIST circuitry is also disclosed. The method includes a step of developing circuit specifications and a step of creating a BIST HDL on a computer system. The circuit specifications include base specifications describing base functionality and BIST specifications describing BIST functionality for an integrated circuit. In a preferred embodiment, the BIST developing step includes receiving BIST user preference information and testable circuit information stored on the computer system.

In addition, a system for creating integrated circuit masks having a digital hardware description processor and a digital mask generator is also disclosed. The digital hardware description processor includes a central processing unit (CPU), digital storage, and a user input device. Both the digital storage and the user input device are coupled to the CPU. Both base and BIST specifications are part of circuit specifications received by the hardware description processor from the user input device. The base and BIST specifications are expressed in base and BIST HDL, and the hardware description processor develops the mask generation data by generating an IC netlist from the base and BIST HDL. The processor stores the mask generation data on the digital storage.

Software stored in a digital form to run on a digital computer to create an HDL description of BIST circuitry is also disclosed. The software includes a user interface generator, a type analyzer, a sub-block analyzer, a sub-block identifier, a sub-block customizer, and a combiner. The interface generator generates a user interface to receive BIST user preference information and testable circuit information. The type analyzer determines a type of BIST circuitry to use. The sub-block analyzer for determines what types of sub-blocks may be required. The sub-block identifier determines the identity of sub-block types. The sub-block customizer customizes sub-blocks requiring customization. The combiner combines the sub-blocks to create a description of a BIST controller in an HDL.

An advantage of the present invention is the description of BIST circuitry at the HDL level of abstraction instead of the netlist level. By automatically generating BIST HDL given BIST specifications and base circuit specifications, a circuit designer is relieved of the complications of gate level synthesis of BIST. Compared with the intricacies of low level netlist descriptions, the highest possible abstraction level, synthesizable behavioral HDL, is easy for designers to understand. This highest level HDL is technology independent and easily modifiable.

These and other advantages of the present invention will become apparent upon reading the following detailed descriptions and studying the various figures of the drawings.

BRIEF DESCRIPTION OF THE DRAWINGS

FIG. 6a is a menu screen illustrating in greater detail the "receive user BIST preferences" step of FIG. 6.

FIG. 6b is a menu screen illustrating in greater detail the "determine RAM type and size" step of FIG. 6.

DETAILED DESCRIPTION OF THE PREFERRED EMBODIMENTS

The present invention provides both a method and an apparatus for creating BIST HDL. A preferred embodiment synthesizes a BIST netlist from BIST HDL and combines it with a previously synthesized netlist. Another preferred embodiment combines BIST HDL with base HDL before synthesizing a netlist. By automatically generating a BIST HDL based upon circuit specifications, the methods greatly reduce the effort required to fabricate BIST circuitry given RAMs, ROMs, or multipliers.

Figure 1:
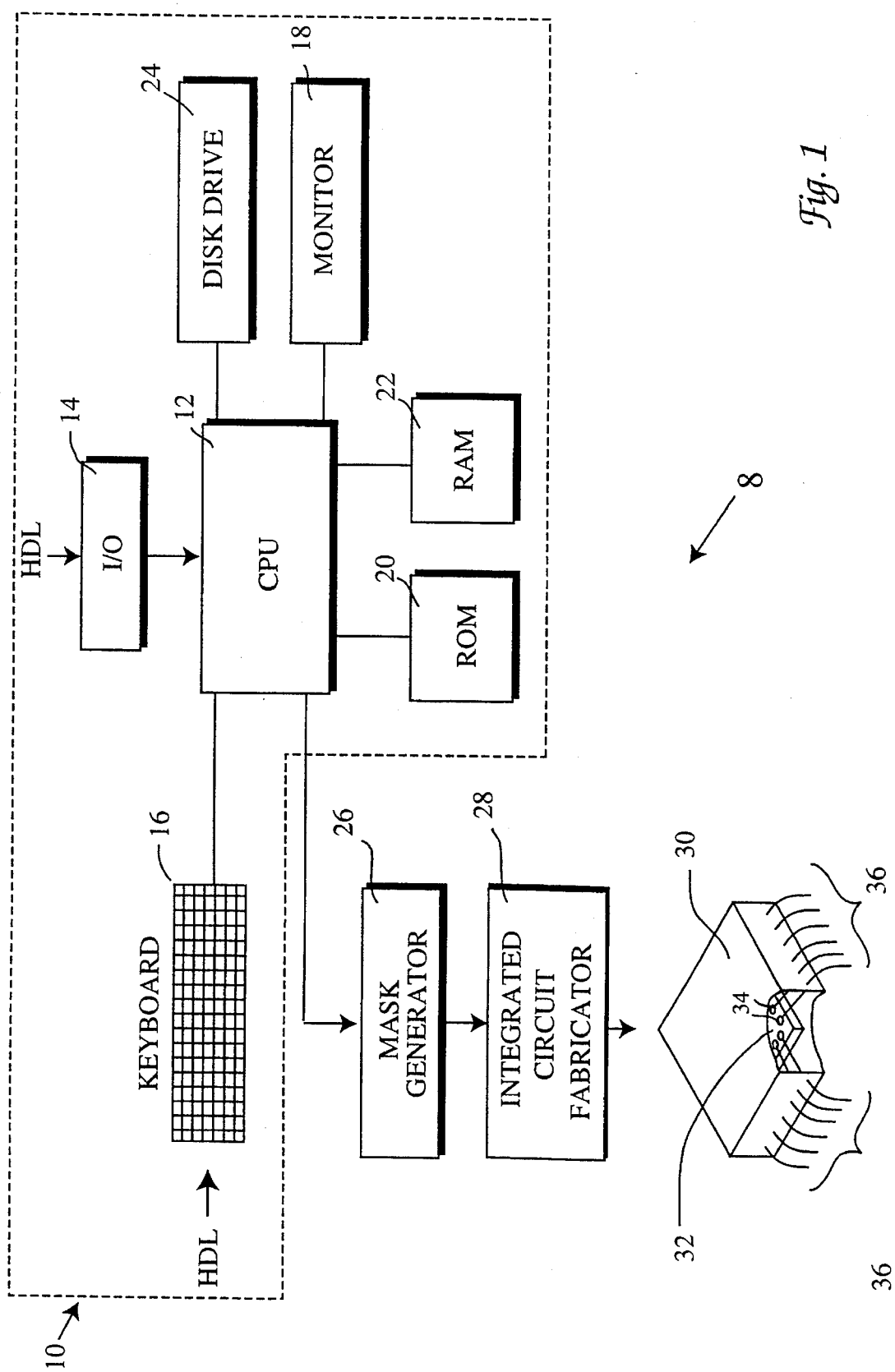
FIG. 1 is a schematic diagram of a block diagram of a system used for creating digital integrated circuits.

A schematic diagram of an integrated circuit fabrication system 8 including a digital hardware description processor 10 of the present invention used as a system for creating digital integrated circuit masks is shown in FIG. 1. The processor 10 includes a central processing unit (CPU) 12, and I/O port 14, a user input device 16, a monitor 18, ROM 20, RAM 22, and a disk drive unit 24. The system 8 also includes a mask generator 26 and an IC fabricator 28. The CPU 12 is coupled to the I/O port 14 and a user input device 16 such as a keyboard. HDL can be received and input into the digital hardware description processor 10 through the I/O port 14, the user input device 16, or another input channel such as the disk drive 24. Typically, HDL received through the I/O port 14 would come from another machine. The user input device 16 is usually a keyboard and/or a pointer device such as a mouse (not shown). It permits the circuit designer to respond to base specification and BIST specification menus displayed on the monitor 18. The base and BIST menus will be described below with reference to FIGS. 6a and 6b.

The digital hardware description processor 10 preferably includes digital storage capacity. As shown in FIG. 1, this digital storage can include ROM 20, RAM 22, and a disk drive 24. The disk drive 24 may store base HDL and BIST HDL received from the I/O port 14 or the user input device 16. The disk drive 24 may also enter base HDL and BIST HDL into the system, and it may store mask generation data created by processes running on the hardware description processor 10 and its CPU 12. The disk drive 24 may be replaced or augmented by other permanent storage devices such as magnetic tape or floppy disks.

Circuit specifications received by the user input device 16 include both base specifications and BIST specifications.

The base specifications describe the base functionality of an integrated circuit 30 to be fabricated while the BIST specifications described the BIST functionality. The base specifications are expressed in a base HDL, and the BIST specifications are expressed in a BIST HDL.

From the base HDL and the BIST HDL, the system 8 develops mask generation data. This mask generation data can be stored in the digital storage such as the disk drive unit 24. The mask generator 26 receives the mask generation data from the CPU 12. Alternatively, the mask generator 26 may receive mask generation data directly from digital storage such as the disk drive 24. The mask generator 26 may be part of the hardware description processor 10, or it may be a separate device as shown. The mask generation data is typically in CalTech Intermediate Format (CIF) and is used by the mask generator 26 to create photolithography masks. An integrated circuit fabricator 28 forms components of the integrated circuit on a wafer using the masks. The masks will be sufficient to create the components of the integrated circuit 30 and the connections between the components. The integrated circuit fabricator 28 includes semiconductor manufacturing equipment such as etchers, machines, photography machines, etc. as are well known to those skilled in semiconductor manufacturing.

The integrated circuit fabricator's 28 final result is a packaged integrated circuit 30 containing a die 32 fabricated from the mask created by the mask generator 26. The semiconductor die 32 contains a digital integrated circuit and I/O pads 34 for coupling the circuit to several leads 36. The I/O pads 34 can be coupled to the leads 36 in any conventional manner such as by bonding wires. BIST circuitry for testing RAMs, ROMs, and multipliers will also be part of the die 32.

Figure 2:
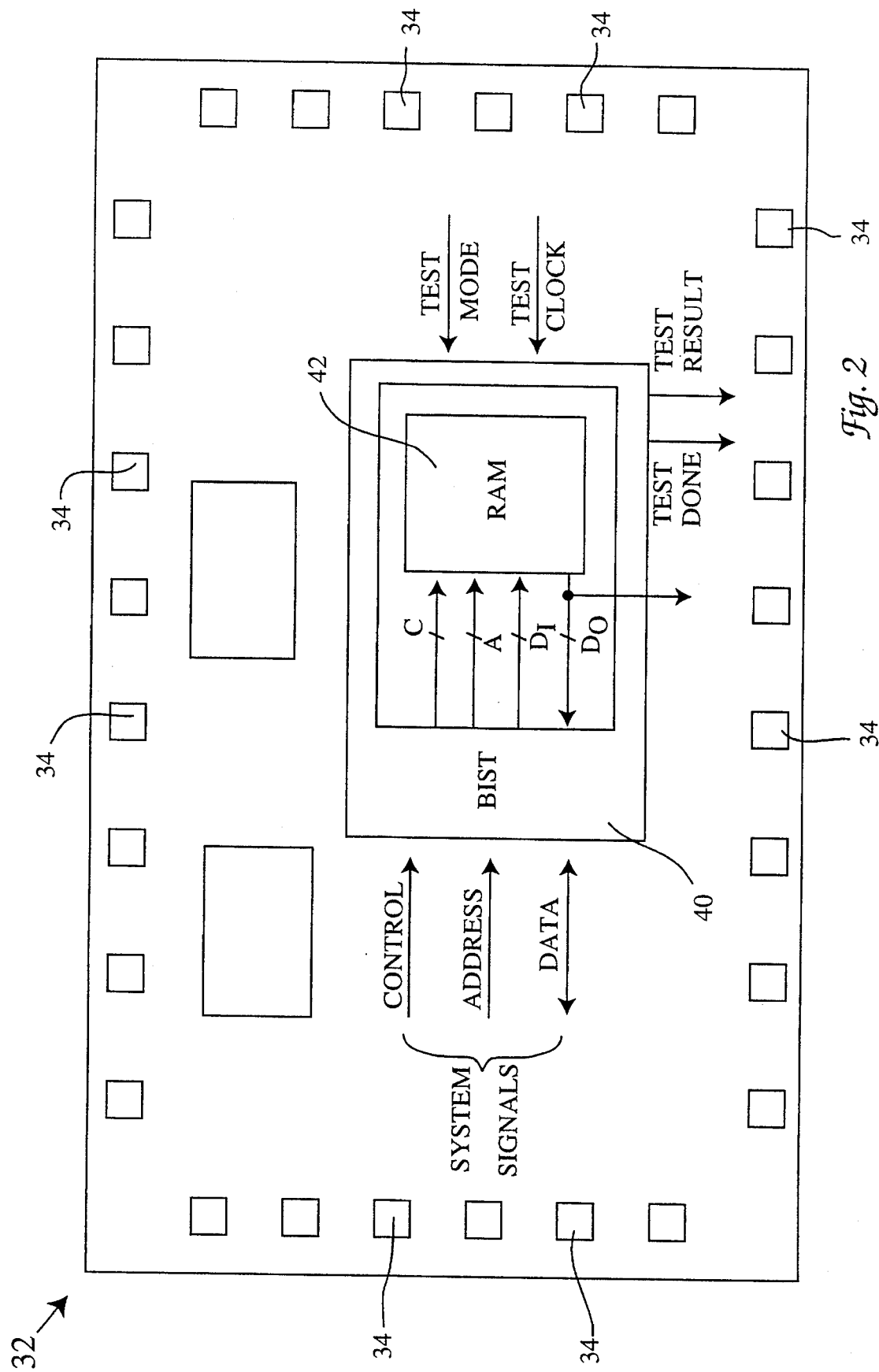
FIG. 2 is a schematic diagram of an integrated circuit including BIST circuitry and RAM.

Referring now to FIG. 2, the integrated circuit die 32 will be described in greater detail. FIG. 2 shows a diagrammatic representation of BIST circuitry 40 coupled to a RAM circuit 42. The RAM circuitry 42 could be replaced by a ROM, a multiplier, or another subcircuit. During normal mode, the RAM 42 is connected to other system signals through the BIST 40. In other words, BIST circuitry 40 interfaces the RAM 42 to other components on the integrated circuit die 32. System signals containing control, address, and data information are transmitted through the BIST circuitry 40 to the RAM 42 during normal operation. Control (C), address (A), data input ($D_I$), and data output ($D_O$) lines connect the BIST circuit 40 with the RAM circuit 42. The BIST circuitry 40 switches to test mode upon receipt of a "test mode" or "test enable" signal along with a test clock signal. Then, the BIST circuit 40 creates test input data $D_I$ to test the RAM circuit 42. The input test data $D_I$ is generated by the BIST 40 itself and is not received from external circuitry via the I/O port 34 or from other subcircuits on the integrated circuit die 32.

Output data $D_O$ is then either compacted in the BIST circuit 40 or compared on the die 32. Compaction is generally performed by a multiple input shift register (MISR). There are three modes for the multiple input shift register (MISR): flag, scan, and signature. In flag mode, the result of the final compaction is flagged as pass or fail. In scan mode, the compaction results are stored in a register which is shifted out at the end of BIST. In signature mode, outputs of the signature registers are directly connected to output pads 34.

As an alternative to using a MISR, a designer can select a comparison mode. In comparison mode the data from the RAM 42 is compared with expected data generated by a control signal generator 52 for every clock cycle.

When the BIST test has been completed, the BIST circuit 40 will generate a "test done" signal and transfer out the results of the test. If compaction has been done, the test results or contents of a compaction test register will be shifted out as the test result.

Figure 3:
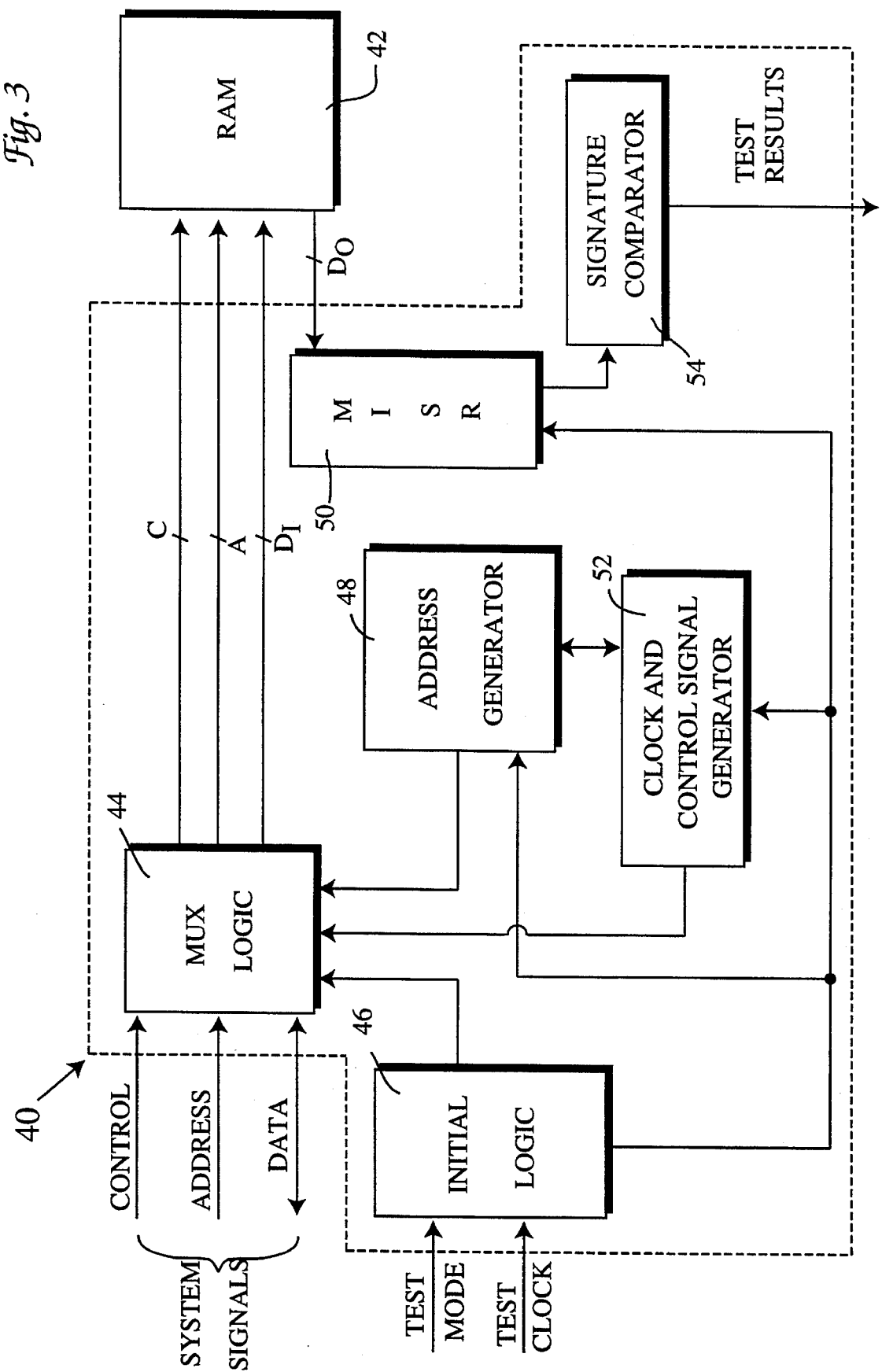
FIG. 3 is a schematic diagram of the BIST circuitry of FIG. 2.

FIG. 3 is a block diagram showing the architecture of the BIST circuit 40 in greater detail. As in FIG. 2, control (C), address (A), data input ($D_I$), and data output ($D_O$) lines connect the BIST circuit 40 with the RAM circuit 42. The architecture for the BIST circuit 40 shown in FIG. 3 conforms with the IEEE 1149.1 Test Access Port and Boundary Scan Architecture of 1990 requiring a four pin test access port having test data input $D_I$, test data output $D_O$, test clock, and test mode enable. An optional fifth port is allowed by the standard. In "normal" or "functional mode", the BIST circuit 40 permits a transparent interaction between other components of the integrated circuit die 32 and the RAM 42 through the multiplexer logic 44. The multiplexer 44 is synthesized in effect to detach the BIST circuit 40 from the RAM 42 during normal mode.

A test mode signal applied to the initialization logic 46 activates the BIST 40. For proper operation, the BIST 40 requires an initialization. The initialization logic 46 commands the multiplexer 44 to decouple the RAM 42 from the other components of the integrated circuit die 32 and couples the BIST 40 to the RAM. The logic 46 also activates the address generator 48, the multiple input shift register (MISR) 50, and the clock and control signal generator 52. Initialization logic 46 requires two test clock cycles for the internal initialization corresponding to one cycle with test mode enable "low" or "not active" and a second cycle with the test mode "high" or "active." Alternatively, an external initialization signal may be applied (not shown).

The clock and control signal generator 52 is the heart of the BIST circuit 40. It generates internal clock signals, address direction signals, read/write enable signals, MISR clock signals, test patterns, and an end-of-test signal for the RAM 42. Rather than relying upon externally generated test patterns, the clock and control signal generator 52 generates the BIST test patterns and transfers them to the RAM 42 undergoing test through the multiplexer logic 44. Test mode and test clock signals are the inputs to the clock and control signal generator 52 and are received by the initialization logic 46.

The address generator 48 generates RAM addresses from 0 to the maximum significant bit (MSB) and from MSB to 0. It also monitors the number of memory scans performed by the BIST 40. Since most embedded RAMs 42 have address spaces which are not a power of two, the address generator will generally be capable of handling memory sizes that are not a power of two.

The multiple input shift register MISR 50 is a particular type of linear feedback shift register (LFSR). An LFSR is a shift register with one or more feedback insertion points. Along with linear cellular automata registers (LCARs), LFSRs form the core of signature analysis techniques for testing and are based on primitive polynomials of Galois Theory. An MISR is an LFSR with multiple inputs. Depending upon whether a flagged, scan, or signature option is selected for synthesis of the BIST circuit 40, the MISR 50 will be constructed to transfer data directly out or to the signature comparator 54 as shown in FIG. 3. For the flag option, the MISR will transfer a signature to the signature comparator 54 resulting in test results being output. In scan mode, data can be scanned out of the MISR at the end of the test and can be computed with a computed signature on an external testing device. In signature mode, the outputs of MISR are multiplexer to the output pads 34 (not shown in FIG. 3).

The signature comparator 54, resulting from the flag option selection, is fabricated with the expected signature built-in. The expected signature is computed at the time of BIST synthesis. Two identical subcomparators producing two test result signals are within the signature comparator 54. If the test were successful and no faults were found, the test results would "go high" indicating identical test results from the subcomparators.

Figure 4:
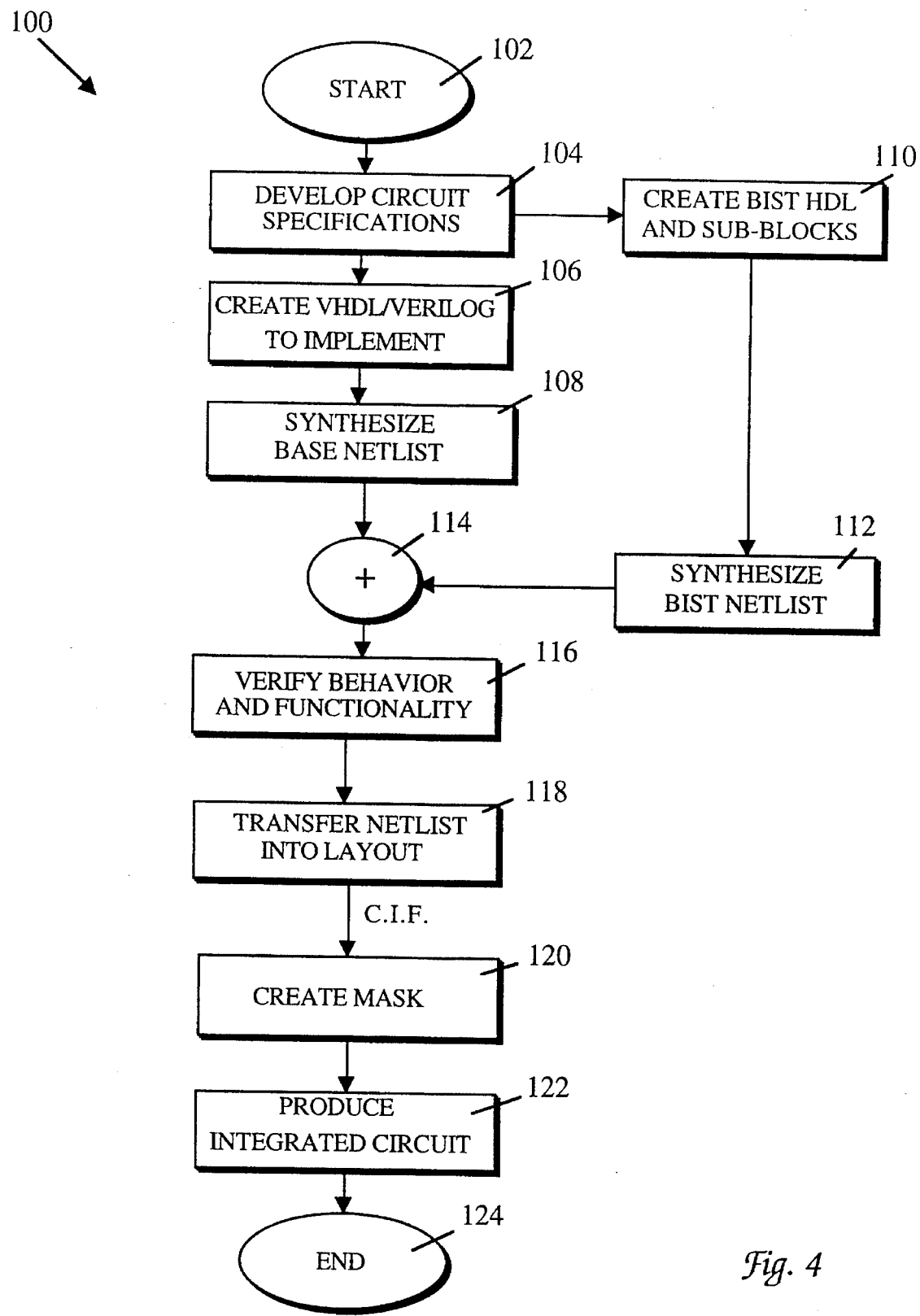
FIG. 4 is a flowchart illustrating a method of the present invention for making a digital integrated circuit with built-in self-test.

Referring next to FIG. 4, a method 100 of the present invention for making a digital integrated circuit with built-in self-test will be described in greater detail beginning at a step 102. In a step 104 a set of circuit specification is developed. Generally, the specifications can include the overall integrated circuit performance with specific size and placement characteristics of components on the chip 32. In particular, base specifications describing base functionality of the IC 32 and built-in self-test for BIST specifications describing BIST functionality may be specified. For the arrangements of FIGS. 2 and 3, the base specifications pertain to functionality of the RAM 42 and other IC components during "normal" or "functional" mode. The BIST specification at least partly describes the BIST circuit 40 and the method for IC 32.

A circuit designer creates a base HDL description of the base specifications in a step 106 using a hardware description language. Common hardware description languages include VHDL and VERILOG although any suitable language can be used. Step 108 synthesize a netlist from the base HDL. The netlist specifies which components will be connected in the IC 32 but not the precise wiring topography. Components described by the netlist will form a circuit satisfying the base circuit specifications.

In a step 110 BIST HDL is created to describe the BIST specifications developed in step 104. Step 110 creates HDL sub-blocks corresponding to the components of the BIST circuit 40 depending upon the BIST specifications developed in step 104. For example, there may be individual HDL sub-blocks describing the multiplexer logic 44, the initialization logic 46, the address generator 48, the MISR 50, the clock and control signal generator 52, and the signature comparator 54 shown in FIG. 3. A BIST netlist is synthesized from the BIST HDL in step 112. The BIST netlist and the base netlist are combined in step 114 to form a combined netlist describing the integrated circuit 32.

The overall behavior and functionality of the integrated circuit 32 to be fabricated is verified in step 116. The circuit designer transforms the netlist description of the integrated circuit 32 into a layout of the integrated circuit in a step 118. This layout step 118 determines the actual physical placement of components on the integrated circuit die or chip 32 to form an array of gates or standard cells. The routing of connections or wires between components is also determined in layout step 118. The mask generation data produced by step 118 is often in CalTech Intermediate Format (CIF). Integrated circuit masks are created in step 120. These masks are used in the fabrication of the integrated circuit chip 32 having built-in self-test circuitry 40. The masks are typically created on a mask generator 26 equipped to read CIF data. This CIF data can be transferred to the mask generator 26 through a hard disk, magnetic tape, a floppy disk, or other media. The mask generator 26 may be part of the hardware description processor 10 that synthesizes the combined netlist in step 114, or it may be a separate machine.

The integrated circuit 32 is produced in a step 122. A conventional method of producing the circuit 32 is to use the mask created in step 120 in a photolithography process on IC fabricator 28. As with the mask generator 26, the IC fabricator 28 may be part of the hardware description processor 10, or it may be a separate machine. Once the chip itself has been fabricated, the integrated circuit on the die must have connections to external circuitry. This is generally accomplished by attaching bonding wires and/or lead frames to the integrated circuit. The circuit is then encapsulated in packaging materials such as plastic. The design and fabrication of the integrated circuit ends at a step 124.

Figure 5:
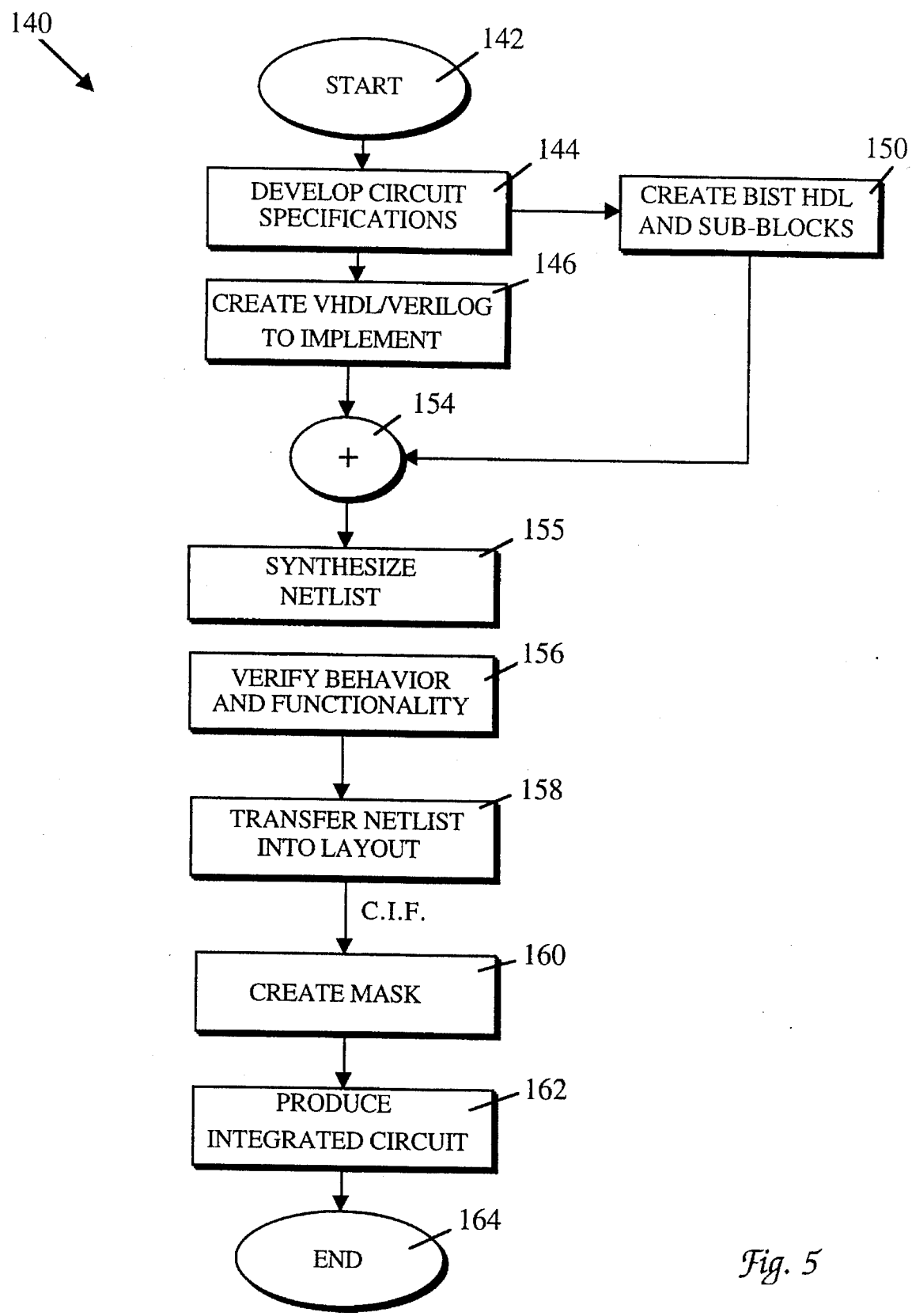
FIG. 5 is a flowchart illustrating a second method of the present invention for making a digital integrated circuit with built-in self-test.

A second embodiment 140 of producing a digital integrated circuit with built-in self-test is described in FIG. 5. This process 140 begins at step 142 and develops base and BIST circuit specifications in step 144. As in FIG. 4, base HDL is developed in step 146, and BIST HDL and sub-blocks are created in step 150. However, instead of combining base and BIST netlists as in FIG. 4, the method 140 combines base HDL produced in step 146 and BIST HDL produced in step 150 in a combination step 154 to produce a combined HDL. A combiner of software stored in digital form and running on a digital computer may perform step 150. A netlist synthesis step 155 then produces a single netlist from the combined HDL instead of the separate base and BIST netlists. Steps 156, 158, 160, 166, and 174 of FIG. 5 have an direct correspondence with steps 116, 118, 120, 122, and 124 of FIG. 4. But, the netlist synthesized in step 155 of FIG. 5 may be different from the netlist of FIG. 4 formed in step 114 from the combination of the base netlist of step 108 and the BIST netlist of step 112.

Step 110 of FIG. 4 and step 150 of FIG. 5 will be described in more detail with reference to FIG. 6 beginning at step 170. In step 172 user BIST preferences are retrieved. Preferably, options for the BIST circuit 40 are displayed on the monitor 18 of the digital computer system 10. Upon viewing the menu on the monitor 18, the circuit designer or user can select the appropriate BIST option using the user input device or keyboard 16. The menu options can correspond to information previously stored in digital storage such as the disk drive 24, ROM 20, or RAM 22. The file retrieved corresponding to the particular combination of options selected by a circuit designer is generally called a "BIST.PCL" file.

Similarly, a circuit designer specifies the RAM type and RAM size in step 174. There are no restrictions on the size of the RAM although the RAM type and size must be determined before BIST HDL can be generated. In fact, step 174 could occur before step 172. As with the BIST preferences, the RAM type and size may be stored in a particular file such as a "RAM.PCL" file. Step 175 determines whether the BIST specifications can be implemented for RAM specifications. By combining the BIST preferences with the RAM information, BIST HDL is generated automatically in step 176 if step 175 is YES. If the BIST preferences specified in step 172 cannot be implemented for the particular RAM specified in step 174, step 177 determines whether default values for the BIST are implemented in step 176. If default values are not desired, the steps 110 and 150 end in step 179. If step 176 implements either BIST specifications obtained in step 172 or default BIST specifications, steps 110 and 150 end at step 178.

Figure 6:
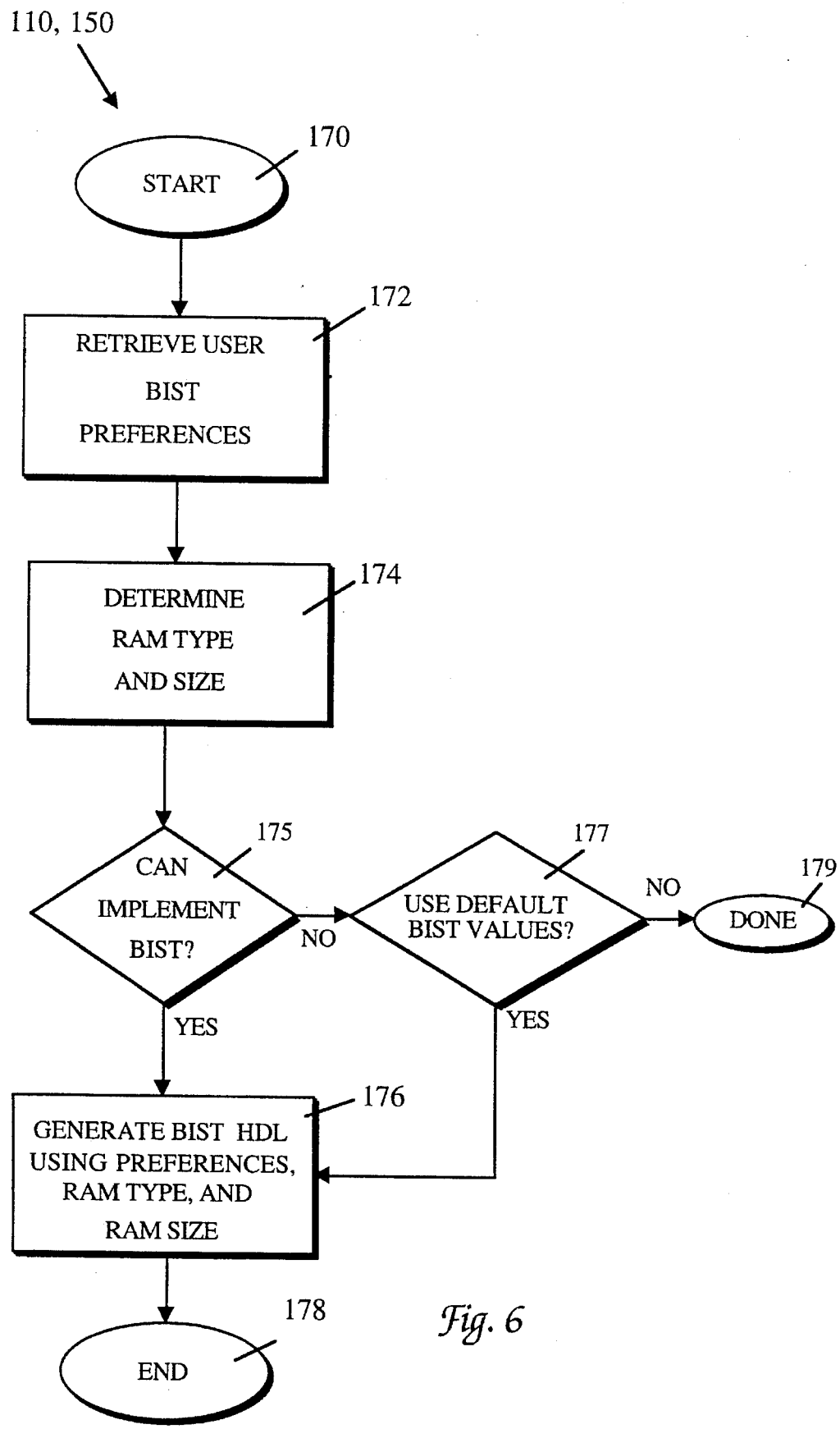
FIG. 6 is a flowchart describing in greater detail the "create BIST HDL" step of FIGS. 4 and 5.

FIG. 6a shows a menu screen presented on monitor 18 listing BIST preferences as part of FIG. 6's step 172. The screen may be created by a user interface generator part of software stored in a digital form on a digital computer. The selections in FIG. 6a correspond to the circuit described in FIG. 3, and the corresponding BIST_DATA.PCL (BIST.PCL) file is in the Appendix A. The prefix "BISTRAM" refers to BIST for RAM as opposed to ROM or a multiplier. "[R]am_data" is the name of the base specification file input by the user. The flag BISTRAM_analysis" determines what type of comparison test is used to determine faults. As discussed with reference to the MISR 50 of FIG. 3, the third option for "BISTRAM_test_results" determines whether a flag, scan, or signature MISR is used. "BISTRAM_init_pin" is true when an external initialization signal initializes the BIST 40. It is false when the initialization signal for the BIST 40 is generated by the initialization logic 46 as shown in FIG. 3. If the circuit designer wishes to have a schematic of the BIST circuit 40, then "BISTRAM_schematic" is selected to be true. The variable "Sim_Option" determines the type of circuit simulation synthesis which the BIST HDL will perform. FIG. 6a shows a simulation using netlist synthesis. The "Layout_Option" further specifies the simulation option to be optimized or portable. For the case of FIG. 4 where a separate BIST netlist is synthesized in step 112, the portable layout option facilitates the combination of the BIST netlist with the base netlist in step 114 of FIG. 4.

FIG. 6b shows an example of a RAM menu displayed on the monitor 18 and may be created by user interface software. The prefix "RS2_" represents a RAM type or class. The variable "RS2_WORD_DEPTH" determines the number of addresses referenced by the address generator 48 of FIG. 3. The user may type in a desired value for the word length on the first line of the menu. Similarly, the number of words may be typed to specify "RS2_WORD_DEPTH." The total number of bits in the RAM 42 is equal to RS2_WORD_LENGTH multiplied by RS2_WORD_DEPTH. The variable "RS2_IO_SEPARATE" is a flag determining whether there are separate data input $D_I$ and data output $D_O$ lines between the BIST 40 and the RAM 42. RS2_IO_SEPARATE can be false only if "RS_OE_PROVIDE" is true (see below). To synthesize the circuit in FIGS. 3 and 4, this variable would be true because there are indeed separate input and output lines. "RS2_AS_SEPARATE" true specifies an address strobe is separated from CEB to allow addresses to be latched into address buffers before a clock's (CEB) falling edge. When RS2_OE_PROVIDE is true, the RAM provides an independent three state output enable control signal. If false, output is a high impedance during precharge. If VSS is selected, the RAM output is a zero or ground voltage and the output is always enabled. In this case, RS2_IO_SEPARATE must be set to true. If "RS2_DS_SEPARATE" is true, a data strobe is separated from CEB to allow data to be latched into input buffers before the clock's falling edge. For a false selection, the data line is connected to CEB internally, and data latches during the falling edge of CEB. For the VDD option, data is connected to VDD internally and data is not latched.

Similarly, "RS2_WS_SEPARATE" true specifies a write strobe separate from CEB to allow write enable bar (WEB) to be latched before the clock's falling edge. For a false value, WEB latches during the falling edge of CEB. For the VDD option, WEB is not latched.

Generally, "netlist" is chosen for "Sim_Option" to create a gate description of the RAM. The "vlsiModel" option is a generic label for behavioral circuit models which are not micro-component descriptions. As with FIG. 6a's BIST menu, an "optimized" value for the "Layout_Option" variable facilitates the combination of base and BIST netlists in step 114 of FIG. 4. These two flags are hard-wired for the present application and are displayed merely to inform the user of the values of these pre-selected parameters. "Compatible_Tag" specifies the technology library specifying the primitive gates used in the netlist construction. For example, the library specifies sets of flip-flops or gates, and the primitive components may vary depending on the micron size of the actual chips. The RAM_DATA.PCL (RAM.PCL) file corresponding to FIG. 6b is listed in Appendix C.

Figure 7:
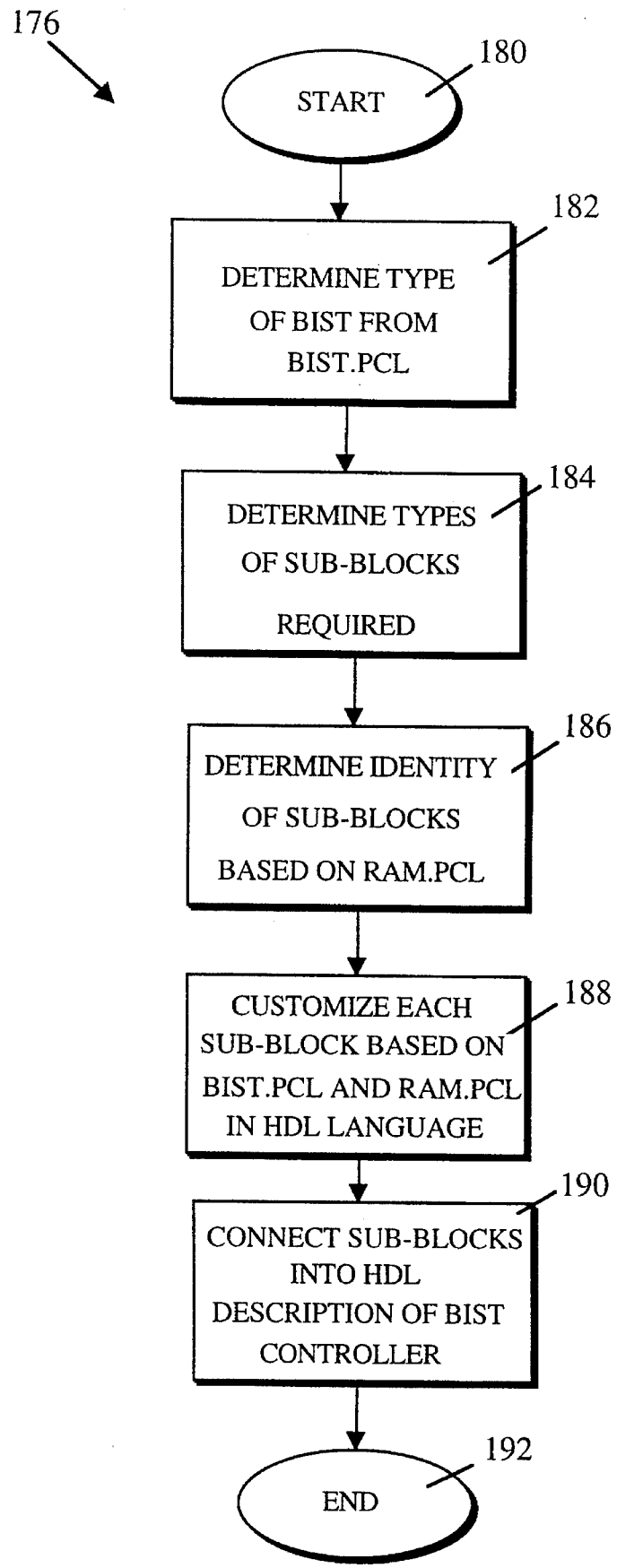
FIG. 7 is a flowchart describing in greater detail the "generate BIST HDL" step of FIG. 6.

FIG. 7 shows a flowchart describing the generate BIST HDL step 176 of FIG. 6 in greater detail beginning at a step 180. Using the BIST preferences retrieved in step 172 of FIG. 6, a BIST type is determined from a BIST.PCL (BIST_DATA.PCL in Appendix A) file in step 182. In a step 184 what types of sub-blocks are required based on the type of BIST determined in step 182. A type analyzer part of software on a digital computer may perform step 184.

From the collection of sub-blocks determined in step 184, a sub block analyzer determines a subset of sub-blocks in step 186 based on RAM information supplied by the RAM.PCL file (RAM_DATA.PCL in Appendix B). A sub-block generator part of software on the digital computer may generate the sub-blocks. In either case, a sub block identifier software may determine the identity of the sub-block types Selected sub-blocks are then customized to form a particular sub-block in HDL corresponding to the combination of information in both the BIST.PCL file and the RAM.PCL file in step 188. Customized HDL sub-blocks corresponding to the FIG. 6a–b example are in the appendices. Step 188 may be performed by sub-block customizer software. The sub-blocks are then connected to form a BIST HDL description of the BIST "controller" or circuit 40 in step 190. Step 176 then ends at step 192.

Figure 8:
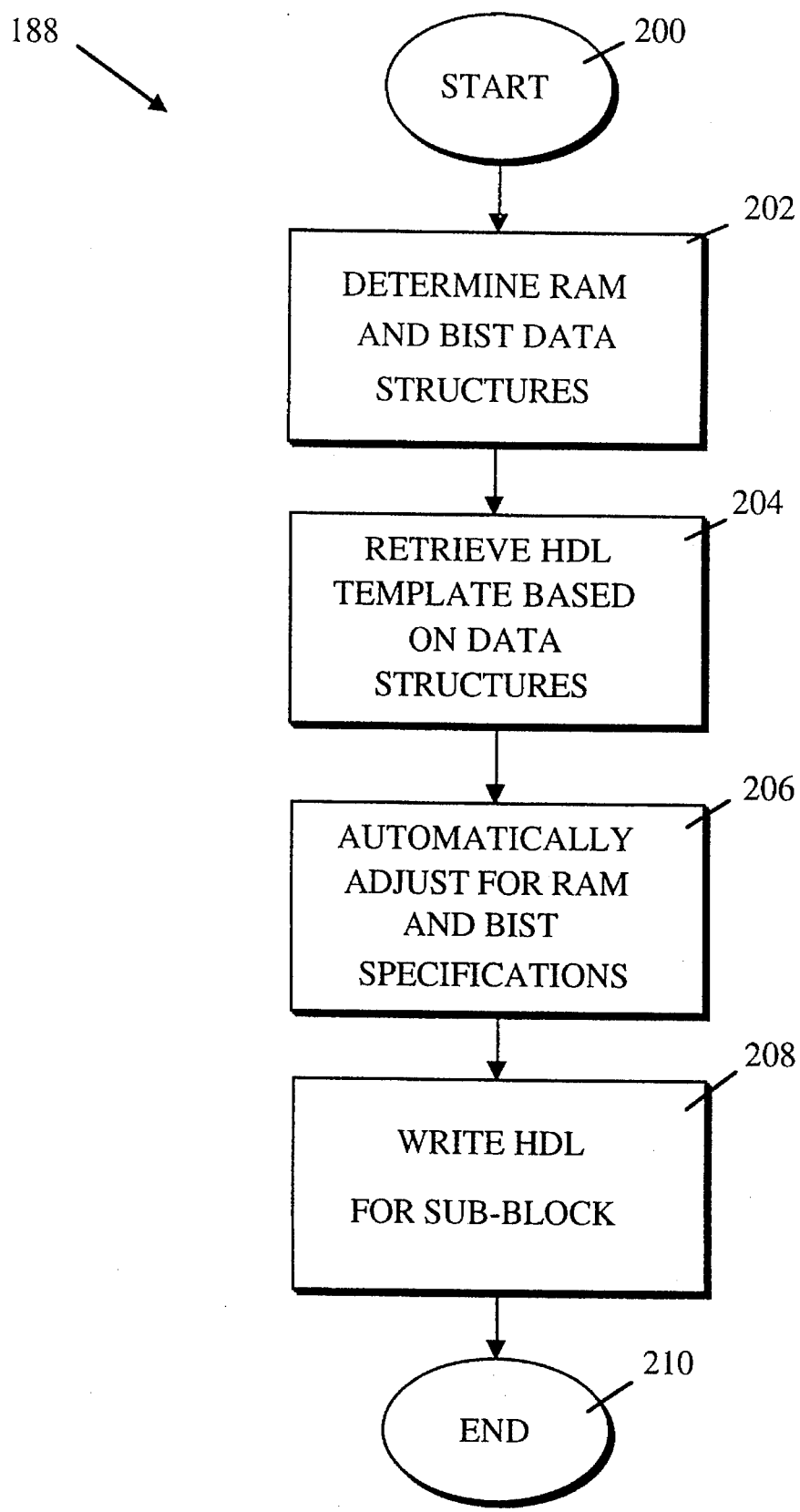
FIG. 8 is a flowchart describing in greater detail the "customize sub-block" step of FIG. 7.

The customization step 188 will be described in more detail for a selected sub-block with reference to FIG. 8 beginning at step 200. RAM and BIST data structures are determined in step 202. The data structures include parameter values obtained from the BIST and RAM specifications and parameter values generic to the classes of BIST and RAM selected. The generic parameters may be stored in BIST and RAM tables of values. For example, there may be a BIST table listing primitive polynomial values. RAM tables may include parameters specifying a RAM as synchronous or asynchronous, dual port, etc. The resulting data structures combine these generic parameters with parameters selected from the BIST and RAM menus. The data structures may be simple lists of values and selected options, or they may have more complicated pointer relationships between parameters.

An HDL template corresponding to the selected sub-block is retrieved in step 204. Given a RAM type and a BIST type, a template for each BIST circuit component will be retrieved. For example, an address generator template providing most of an HDL software program will be retrieved in step 204. Specific parameters such as the precise RAM address allocation input by the RAM menu in FIG. 6b will be required.

The template will be a nearly complete sub-block except for adjustments depending on the BIST and RAM specifications which are made in step 206. Different types of sub-blocks will require different types of adjustments. The address generator software may specify the RAM address and create a valid address signal. A control generator sub-block may obtain specific control signals in step 206, and a signal comparator may obtain a specific signature value for comparison during built-in self-testing. Primitive polynomial values may be required to turn the MISR sub-block template into the MISR HDL sub-block. Thereafter, the HDL sub-block is formed with these adjustments in step 208, and step 188 ends at step 210 for the selected sub-block.

A MAINSAIL software program, "BITVHD.MS", which generates the sub-block is listed in Appendix C. The "boolean procedure" routines in BITVHD.MS contain the VHDL templates retrieved in step 204. The templates themselves essentially form models for how to describe classes of BISTs in VHDL. The inputs to BITVHD.MS are the data structures constructed determined in step 202. Step 175's check of BIST and RAM specification compatibility is performed by BITOPT.MSI listed in Appendix D. BISTOPT.MSI is borrowed from previous BIST netlist algorithms.

The HDL sub-blocks written in VHDL produced by step 210 are listed in the remaining appendices. "BIST_DATA_ADDGEN6" in Appendix E is a VHDL computer code describing the address generator 48 capable of accessing $2^6$ addresses. "BIST_DATA_COMPARE16" in Appendix F describes the 16 bit signature comparator 54. Appendix G's "BIST_DATA_CONTROL8" describes part of the control signal generator 52. The initial logic 46 is described in VHDL in "BIST_DATA_INIT" in Appendix H. FIG. 4's sixteen bit multiple input signature register (MISR) 50 is described by Appendix I's "BIST_DATA_MISR16". "BIST_DATA_TOP_BIST16" in Appendix J is a top level VHDL computer routine corresponding the BIST 40 and tying together the various subroutines such as BIST_DATA_ADDGEN6 and BIST_DATA_COMPARE16 corresponding to BIST components shown in FIG. 4. BIST_DATA_TOP_BIST16 is created in step 190 of FIG. 7.

While this invention has been described in terms of several preferred embodiments, there are alterations, permutations, and equivalents which fall within the scope of this invention. It should also be noted that there are many alternative ways of implementing both the process and apparatus of the present invention. It is therefore intended that the following appended claims be interpreted as including all such alterations, permutations, and equivalents as fall within the true spirit and scope of the present invention.

APPENDIX A: BIST_DATA.PCL

```
*  .
# VERSION NUMBER
2
# TEMPLATE
# name date time checkSum
bistram "17-Nov-58 GMT" "8:00:00 GMT" 'H5FBD2960
  # CLIENT OBJECTS (generator modules, etc.)
# ID cellName cellType capabilities
1 bitram nc   Model-Schematic Portable-Netlist
2 bistram la  Icon
3 vbitra vce  Generate-Vectors
4 sbitra ese  DA
5 bitrab obj  Bist-Connection
  .
# PARAMETERS
# name value default type flags clientIDs / range
BISTRAM_ram_pcl_file ram_data cram01_1 string [s,Spec:LA] 1 2 3 5
BISTRAM_analysis signature signature string [s] 1 2 3 5 / signature compare
BISTRAM_test_result flag flag string [s] 1 2 3 5 / flag scan signature
BISTRAM_init_pin false false boolean [s] 1 2 3 5
BISTRAM_schematic false false boolean [] 1 2 3 5
Sim_Option netlist netlist string [] 1 2 3 5 / netlist
Layout_Option portable portable string [] 1 2 3 5 / portable
Compatible_Tag "" "" string [h] 1 2 3
  .
```

APPENDIX B: RAM_DATA.PCL

```
*  .
# VERSION NUMBER
2
# TEMPLATE
# name date time checkSum
rs2 "15-Dec-92 GMT" "0:43:46 GMT" 'H2674EBD6
# CLIENT OBJECTS (generator modules, etc.)
# ID cellName cellType capabilities
1 VCRS2C vpe  CIF
2 VCRS2M mde  MODEL Model-Schematic Layout-Model-Netlist
3 VCRS2D ese  DA
4 VCRS2P cpe  Make-PMD
5 VCRS2V vce  Generate-Vectors
6 CRS2 la  Icon
7 VCRS2T nc  Transistor-Netlist
8 BRAM02 obj  VHDL-MODEL Verilog-Model
9 BISTRAM tpl  Bist
.
# PARAMETERS
# name value default type flags clientIDs / range
RS2_WORD_LENGTH 8 8 integer [s] 1 / 4 32
RS2_WORD_DEPTH 64 64 integer [s] 1 / 64 4096
RS2_IO_SEPARATE true true boolean [s] 1
RS2_AS_SEPARATE false false boolean [s] 1
RS2_OE_PROVIDE YES YES string [s] 1 / YES NO VSS
RS2_DS_SEPARATE NO NO string [s] 1 / YES NO VDD
RS2_WS_SEPARATE NO NO string [s] 1 / YES NO VDD
Sim_Option netlist netlist string [] / vlsiModel netlist
Layout_Option optimized optimized string [] / optimized
HDL_Option behavioral behavioral string [] 8 / behavioral
Compatible_Tag vsc450 vsc450 string []
.
```

APPENDIX C: BITVHD.MS

```
begin "bitvhd"

sourcefile "(prism)";

# interface modules
getdec(types)
getint(bitvhd)   # VHDL BIST
getint(pman)     # Project Manager
getint(uiap)     # Generic User Interface
getint(bitutl)   # BIST Utilities
getint(bitopt)   # Bist Options
getint(pmrim)    # rim file handler

Globals ---------------------------------------# define
   strEqu(i,j) = [equ(i,j,uppercase)];

#---------------------------------------------------------------#
# generateHeader
# This procedure Adds Header Section to VHDL Modules
---------------------------------------------------------------# procedure generateHeader ( pointer (textfile) vhdfile;

);

begin uiapWriteTextFile(vhdfile,"Library ieee;",eol);
   uiapWriteTextFile(vhdfile,"Library COMPASS_LIB;",eol);
   uiapWriteTextFile(vhdfile,"USE ieee.STD_Logic_1164.ALL;",eol);
   uiapWriteTextFile(vhdfile,"USE COMPASS_LIB.COMPASS.ALL;",eol);

return;
end;

procedure headerMsg ( pointer (textfile) vhdfile;
   string mName;
   string mtype;
);

begin uiapWriteTextFile(vhdfile,"----------------------------------------",eol)
   uiapWriteTextFile(vhdfile,"--        [COMPASS DESIGN AUTOMATION]    --",eol)
   uiapWriteTextFile(vhdfile,"--                                       --",eol)
   uiapWriteTextFile(vhdfile,"--              VHDL BIST MODULE         --",eol)
   uiapWriteTextFile(vhdfile,"--                                       --",eol)
   uiapWriteTextFile(vhdfile,"--                 Generated By          --",eol)
```

```
   uiapWriteTextFile(vhdfile,"--                                                           --",eol)
   uiapWriteTextFile(vhdfile,"--            VHDL BIST GENERATOR                            --",eol)
   uiapWriteTextFile(vhdfile,"-------------------------------------------------------------",eol)
   uiapWriteTextFile(vhdfile,"-- Module Name :",mName,".vhd",eol);
   uiapWriteTextFile(vhdfile,"-- Module Type :",mtype,eol);
#  uiapWriteTextFile(vhdfile,"-- ",$disassenbleDateAndTime($dateAndTime),eol);

return;
end;

boolean procedure makeAddressGenerator ( string  mname;
   integer nbits;
);

begin string filename,msg;
   pointer (textfile) fvhd;
   filename := msg := "";
   write(filename,mname,"_addgen",nbits);

fvhd := pman.openCellForWriting(filename, vhdType);
   if NOT fvhd thenb
      write (msg,"ERROR, Unable to Open the File [vhd]",filename,eol);
      uiapRequestPostMessage(msg);
      return(false);
   end;

headerMsg(fvhd,filename,"BIST ADDRESS GENERATOR");
   generateHeader(fvhd);

PORT Declarations uiapWriteTextFile(fvhd,eol,eol,"ENTITY ",filename, " IS",eol,eol);

uiapWriteTextFile(fvhd, " PORT ( cdn, cp  : IN BIT;",eol);
   uiapWriteTextFile(fvhd, "        qout, qoutn : OUT BIT_VECTOR (",nbits-1,
       " DOWNTO 0);",eol);
   uiapWriteTextFile(fvhd, "        testmodecarry : OUT BIT",eol);
   uiapWriteTextFile(fvhd, "      );",eol);
   uiapWriteTextFile(fvhd, "END ",filename,";",eol,eol);

Architecture Body uiapWriteTextFile(fvhd,"ARCHITECTURE synth OF ",filename, " IS",eol);
   # Variables & Signals uiapWriteTextFile(fvhd," SIGNAL value : INTEGER range 0 to ", (2^nbits)
-1,";",eol);

BODY uiapWriteTextFile(fvhd,"BEGIN",eol,eol);

uiapWriteTextFile(fvhd, "  PROCESS(cp, cdn)",eol);
   uiapWriteTextFile(fvhd, "  BEGIN",eol);
   uiapWriteTextFile(fvhd, "    IF (cdn = '0') THEN",eol);
   uiapWriteTextFile(fvhd, "      value <= 0;",eol);
   uiapWriteTextFile(fvhd, "    ELSIF (cp'event AND cp = '1') THEN",eol);
   uiapWriteTextFile(fvhd, "      IF (value >=",(2^nbits)-1,") THEN",eol);
```

```
        uiapWriteTextFile(fvhd, "      value <=0;",eol);
        uiapWriteTextFile(fvhd, "    ELSE",eol);
        uiapWriteTextFile(fvhd, "      value <= value + 1;",eol);
        uiapWriteTextFile(fvhd, "    END IF;",eol);
 5      uiapWriteTextFile(fvhd, "    END IF;",eol);
        uiapWriteTextFile(fvhd, "END PROCESS;",eol,eol);
        uiapWriteTextFile(fvhd, " qout <= ItoBV(value,",nbits,");",eol);
        uiapWriteTextFile(fvhd, " qoutn <= NOT(ItoBV(value,",nbits,"));",eol);
        uiapWriteTextFile(fvhd, " testmodecarry <=
10   reduce_and(ItoBV(value,",nbits,"));",eol,eol);
        uiapWriteTextFile(fvhd, "END synth;",eol);
        pman.cellHasBeenWritten (filename,vhdType,fvhd);
        return(TRUE);
     end;
15
     boolean procedure makeInitGen ( string mname;
     );
20
     begin string filename,msg;
        pointer (textfile) fvhd;
25      filename := msg := "";
        write(filename,mname,"_init");

fvhd := pman.openCellForWriting(filename, vhdType);
        if NOT fvhd thenb
30        write (msg,"ERROR, Unable to Open the File [vhd]",filename,eol);
          uiapRequestPostMessage(msg);
          return(false);
        end;

35      headerMsg(fvhd,filename,"BIST INIT SIGNAL GENERATOR");
        generateHeader(fvhd);

PORT Declarations
        uiapWriteTextFile(fvhd,"ENTITY ",filename," IS",eol);
40      uiapWriteTextFile(fvhd," PORT (cp : IN BIT;",eol);
        uiapWriteTextFile(fvhd,"       testmode : IN BIT;",eol);
        uiapWriteTextFile(fvhd,"       init : OUT BIT",eol);
        uiapWriteTextFile(fvhd,"      );",eol);
        uiapWriteTextFile(fvhd,"END ",filename,";",eol,eol);
45
        uiapWriteTextFile(fvhd,"ARCHITECTURE synth OF ",filename," IS",eol,eol);
        uiapWriteTextFile(fvhd," SIGNAL flag : BIT;",eol);
        uiapWriteTextFile(fvhd,"BEGIN",eol);

50      uiapWriteTextFile(fvhd," PROCESS (cp)",eol);
        uiapWriteTextFile(fvhd," BEGIN",eol);
        uiapWriteTextFile(fvhd,"    IF (cp'event AND cp = '1') THEN",eol);
        uiapWriteTextFile(fvhd,"      IF testmode = '0' THEN",eol);
        uiapWriteTextFile(fvhd,"        flag <= '1';",eol);
55      uiapWriteTextFile(fvhd,"      ELSIF testmode = '1' THEN",eol);
        uiapWriteTextFile(fvhd,"        flag <= '0';",eol);
        uiapWriteTextFile(fvhd,"      END IF;",eol);
        uiapWriteTextFile(fvhd,"    END IF;",eol);
        uiapWriteTextFile(fvhd," END PROCESS;",eol,eol);
60
        uiapWriteTextFile(fvhd," PROCESS (cp)",eol);
        uiapWriteTextFile(fvhd," BEGIN",eol);
```

```
        uiapWriteTextFile(fvhd,"    IF (cp'event AND cp = '0') THEN",eol);
        uiapWriteTextFile(fvhd,"      IF (testmode = '0') THEN",eol);
        uiapWriteTextFile(fvhd,"        init <= '1';",eol);
        uiapWriteTextFile(fvhd,"      ELSIF (testmode = '1' AND flag = '1') THEN",eol
        uiapWriteTextFile(fvhd,"        init <= '0';",eol);
        uiapWriteTextFile(fvhd,"      ELSIF (testmode = '1' AND flag = '0') THEN",eol
        uiapWriteTextFile(fvhd,"        init <= '1';",eol);
        uiapWriteTextFile(fvhd,"      END IF;",eol);
        uiapWriteTextFile(fvhd,"    END IF;",eol);
        uiapWriteTextFile(fvhd,"  END PROCESS;",eol);

uiapWriteTextFile(fvhd,"END synth;",eol);
        pman.cellHasBeenWritten (filename,vhdType,fvhd);
        return(TRUE);
    end;

boolean procedure MakeControlGenerator ( string mname;
        integer dbits;
    );

begin string filename,msg;
        pointer (textfile) fvhd;
        integer count;
        filename := msg := "";
        write(filename,mname,"_control",dbits);

fvhd := pman.openCellForWriting(filename, vhdType);
        if NOT fvhd thenb
            write (msg,"ERROR, Unable to Open the File [vhd]",filename,eol);
            uiapRequestPostMessage(msg);
            return(false);
        end;

headerMsg(fvhd,filename,"BIST CONTROL SIGNAL GENERATOR");
        generateHeader(fvhd);

PORT Declarations uiapWriteTextFile(fvhd,"ENTITY ",filename," IS",eol);
        uiapWriteTextFile(fvhd,"  PORT (cdn, cp  : IN BIT;",eol);
        uiapWriteTextFile(fvhd,"         endoftest  : OUT BIT;",eol);
        uiapWriteTextFile(fvhd,"         invertaddress : OUT BIT;",eol);
        uiapWriteTextFile(fvhd,"         ramdata  : OUT BIT_VECTOR(",dbits-1,
                 " DOWNTO 0);",eol);
        uiapWriteTextFile(fvhd,"         readwriten : OUT BIT;",eol);
        uiapWriteTextFile(fvhd,"         signatureclk : OUT BIT;",eol);
        uiapWriteTextFile(fvhd,"         stimulusclk : OUT BIT;",eol);
        uiapWriteTextFile(fvhd,"         testmodecarryin : IN BIT",eol);
        uiapWriteTextFile(fvhd,"        );",eol);
        uiapWriteTextFile(fvhd,"END ",filename,";",eol);

uiapWriteTextFile(fvhd,"ARCHITECTURE synth OF ",filename," IS",eol,eol);
        uiapWriteTextFile(fvhd,"  SIGNAL counter : INTEGER range 0 to 3;",eol);
        uiapWriteTextFile(fvhd,"  SIGNAL eot, sigclk, sitclk, rwn, data :
    BIT;",eol,eol);

uiapWriteTextFile(fvhd,"BEGIN",eol);
        uiapWriteTextFile(fvhd,"  PROCESS (cp, cdn)",eol);
```

```
uiapWriteTextFile(fvhd," BEGIN",eol);
uiapWriteTextFile(fvhd,"   IF (cdn = '0') THEN", eol);
uiapWriteTextFile(fvhd,"     sigclk <= '0';",eol);
uiapWriteTextFile(fvhd,"     sitclk <= '0';",eol);
uiapWriteTextFile(fvhd,"     rwn    <= '0';",eol);
uiapWriteTextFile(fvhd,"     data   <= '0';",eol);
uiapWriteTextFile(fvhd,"   ELSIF (cp'event AND cp = '1') THEN",eol);
uiapWriteTextFile(fvhd,"     IF (counter = 0 AND eot = '0') THEN", eol);
uiapWriteTextFile(fvhd,"       sitclk <= NOT(sitclk);",eol);
uiapWriteTextFile(fvhd,"       sigclk <= '0';",eol);
uiapWriteTextFile(fvhd,"       rwn    <= '0';",eol);
uiapWriteTextFile(fvhd,"       data   <= '0';",eol);
uiapWriteTextFile(fvhd,"       IF (testmodecarryin = '1') THEN",eol);
uiapWriteTextFile(fvhd,"         rwn <= '1';",eol);
uiapWriteTextFile(fvhd,"       END IF;",eol);
uiapWriteTextFile(fvhd,"     ELSIF (counter = 1 AND eot = '0') THEN",eol);
uiapWriteTextFile(fvhd,"       sitclk <= NOT(sitclk);",eol);
uiapWriteTextFile(fvhd,"       sigclk <= NOT(sigclk);",eol);
uiapWriteTextFile(fvhd,"       rwn    <= NOT(rwn);",eol);
uiapWriteTextFile(fvhd,"       data   <= NOT(data);",eol);
uiapWriteTextFile(fvhd,"       IF (testmodecarryin = '1') THEN", eol);
uiapWriteTextFile(fvhd,"         data <= '1';",eol);
uiapWriteTextFile(fvhd,"       END IF;",eol);
uiapWriteTextFile(fvhd,"     ELSIF (counter = 2 AND eot = '0') THEN",eol);
uiapWriteTextFile(fvhd,"       sitclk <= NOT(sitclk);",eol);
uiapWriteTextFile(fvhd,"       sigclk <= NOT(sigclk);",eol);
uiapWriteTextFile(fvhd,"       rwn    <= NOT(rwn);",eol);
uiapWriteTextFile(fvhd,"       data   <= NOT(data);",eol);
uiapWriteTextFile(fvhd,"     ELSIF (counter = 3 AND eot = '0') THEN",eol);
uiapWriteTextFile(fvhd,"       sitclk <= NOT(sitclk);",eol);
uiapWriteTextFile(fvhd,"       sigclk <= NOT(sigclk);",eol);
uiapWriteTextFile(fvhd,"       rwn    <= '1';",eol);
uiapWriteTextFile(fvhd,"       data   <= '0';",eol);
uiapWriteTextFile(fvhd,"     END IF;",eol);
uiapWriteTextFile(fvhd,"   END IF;",eol);
uiapWriteTextFile(fvhd," END PROCESS;",eol,eol);
uiapWriteTextFile(fvhd," PROCESS (sitclk, cdn)",eol);
uiapWriteTextFile(fvhd," BEGIN",eol);
uiapWriteTextFile(fvhd,"   IF (cdn = '0') THEN",eol);
uiapWriteTextFile(fvhd,"     counter <= 0;",eol);
uiapWriteTextFile(fvhd,"     eot     <= '0';",eol);
uiapWriteTextFile(fvhd,"   ELSIF (sitclk'event AND sitclk = '1') THEN",eol);
uiapWriteTextFile(fvhd,"     IF (testmodecarryin = '1') THEN",eol);
uiapWriteTextFile(fvhd,"       counter <= counter +1;",eol);
uiapWriteTextFile(fvhd,"       IF (counter >= 3) THEN",eol);
uiapWriteTextFile(fvhd,"         counter <= 0;",eol);
uiapWriteTextFile(fvhd,"         eot     <= '1';",eol);
uiapWriteTextFile(fvhd,"       END IF;",eol);
uiapWriteTextFile(fvhd,"     END IF;",eol);
uiapWriteTextFile(fvhd,"   END IF;",eol);
uiapWriteTextFile(fvhd," END PROCESS;",eol,eol);

uiapWriteTextFile(fvhd," PROCESS(counter, invertaddress)",eol,eol);
uiapWriteTextFile(fvhd," VARIABLE mycount : BIT_VECTOR(1 DOWNTO 0);",eol);
uiapWriteTextFile(fvhd," BEGIN",eol);
uiapWriteTextFile(fvhd,"   mycount := ItoBV(counter,2);",eol);
uiapWriteTextFile(fvhd,"   invertaddress <= mycount(1);",eol);
uiapWriteTextFile(fvhd," END PROCESS;",eol,eol);

uiapWriteTextFile(fvhd," stimulusclk  <= sitclk;",eol);
uiapWriteTextFile(fvhd," signatureclk <= sigclk;",eol);
uiapWriteTextFile(fvhd," readwriten   <= rwn;",eol);
```

```
      uiapWriteTextFile(fvhd," endoftest     <= eot;",eol);

for count := 0 upto dbits-1 do begin
      if (count MOD 2) = 0 then
          uiapWriteTextFile(fvhd," ramdata(",count,") <= NOT(data);",eol)
      else
          uiapWriteTextFile(fvhd," ramdata(",count,") <= data;",eol);
    end;

uiapWriteTextFile(fvhd,"END synth;",eol);

pman.cellHasBeenWritten (filename,vhdType,fvhd);
    return(TRUE);
end;

boolean procedure makeCOMP ( string mname;
    integer dbits;
    boolean array (0 to *) sigArray;

);

begin string filename,msg;
    pointer (textfile) fvhd;
    integer count;
    string signature;

filename := msg := "";
    write(filename,mname,"_compare",dbits);

fvhd := pman.openCellForWriting(filename, vhdType);

if NOT fvhd thenb
      write (msg,"ERROR, Unable to Open the File [vhd]",filename,eol);
      uiapRequestPostMessage(msg);
      return(false);
    end;

headerMsg(fvhd,filename,"BIST SIGNATURE COMPARATOR");
    generateHeader(fvhd);

for count := dbits-1 downto 0 do begin
      if sigArray[count] then
        write(signature,"1")
      else
        write(signature,"0");
    end;

# PORT Declarations
    uiapWriteTextFile(fvhd,"ENTITY ",filename," IS",eol);
    uiapWriteTextFile(fvhd," PORT (in1 : IN BIT_VECTOR (",dbits-1," DOWNTO 0);",eol);
    uiapWriteTextFile(fvhd,"              in2 : IN BIT_VECTOR (",dbits-1," DOWNTO 0);",eol);
    uiapWriteTextFile(fvhd,"              out1 : OUT BIT;",eol);
    uiapWriteTextFile(fvhd,"              out2 : OUT BIT",eol);
    uiapWriteTextFile(fvhd,"       );",eol);
```

```
      uiapWriteTextFile(fvhd,"END ",filename,";",eol);

uiapWriteTextFile(fvhd,"ARCHITECTURE synth OF ",filename," IS",eol);
      uiapWriteTextFile(fvhd,"BEGIN",eol);

uiapWriteTextFile(fvhd," PROCESS(in1,out1)",eol);
      uiapWriteTextFile(fvhd," BEGIN",eol);
      uiapWriteTextFile(fvhd,"   IF (in1 = """,signature,""") THEN",eol);
      uiapWriteTextFile(fvhd,"     out1 <= '1';",eol);
      uiapWriteTextFile(fvhd,"   ELSE",eol);
      uiapWriteTextFile(fvhd,"     out1 <= '0';",eol);
      uiapWriteTextFile(fvhd,"   END IF;",eol);
      uiapWriteTextFile(fvhd," END PROCESS;",eol,eol);

uiapWriteTextFile(fvhd,"        PROCESS(in2,out2)",eol);
      uiapWriteTextFile(fvhd,"        BEGIN",eol);
      uiapWriteTextFile(fvhd,"          IF (in2 =""",signature,""") THEN",eol);
      uiapWriteTextFile(fvhd,"            out2 <= '1';",eol);
      uiapWriteTextFile(fvhd,"          ELSE",eol);
      uiapWriteTextFile(fvhd,"            out2 <= '0';",eol);
      uiapWriteTextFile(fvhd,"          END IF;",eol);
      uiapWriteTextFile(fvhd,"        END PROCESS;",eol);
      uiapWriteTextFile(fvhd,"END synth;",eol);
      pman.cellHasBeenWritten (filename,vhdType,fvhd);
      return(TRUE);
    end;

boolean procedure makeMISR ( string mname;
      integer dbits;
      integer misrSize;
      boolean array (0 to *) inPoly;

);

begin integer polycount, inputcount;
      string filename,msg;
      pointer (textfile) fvhd;
      integer count;
      boolean array (0 to *) misrPoly;
      filename := msg := "";
      write(filename,mname,"_misr",misrSize);

fvhd := pman.openCellForWriting(filename, vhdType);
      if NOT fvhd thenb
         write (msg,"ERROR, Unable to Open the File [vhd]",filename,eol);
         uiapRequestPostMessage(msg);
         return(false);
      end;
      new (misrPoly,0,misrSize-1);
      for count :=0 upto misrSize-2 dob
         misrPoly[misrSize-1-count] := inPoly[count];
      end;

uiapWriteTextFile(fvhd,"-- INPUT MISR POLY : ");
      for count := 0 upto misrSize-2 dob
         if inPoly[count] then
```

```
          uiapWriteTextFile(fvhd,"1")
        else
          uiapWriteTextFile(fvhd,"0");
      end;
    uiapWriteTextFile(fvhd,eol);

uiapWriteTextFile(fvhd,"-- NEW MISR POLY : ");
    for count := 0 upto misrSize-2 dob
      if misrPoly[count] then
        uiapWriteTextFile(fvhd,"1")
      else
        uiapWriteTextFile(fvhd,"0");
    end;
    uiapWriteTextFile(fvhd,eol);

headerMsg(fvhd,filename,"BIST MISR");
    generateHeader(fvhd);

uiapWriteTextFile(fvhd,"ENTITY ",filename," IS",eol);
    uiapWriteTextFile(fvhd," PORT ( cdn, cp : IN BIT;",eol);
    uiapWriteTextFile(fvhd,"           ramout : IN BIT_VECTOR (",dbits-1," DOWNTO 0);",eol);
    uiapWriteTextFile(fvhd,"           signature: OUT BIT_VECTOR (",misrSize-1," DOWNTO 0)",eol);
    uiapWriteTextFile(fvhd,"       );",eol);

uiapWriteTextFile(fvhd,"END ",filename,";",eol,eol);
    uiapWriteTextFile(fvhd,"ARCHITECTURE synth OF ",filename," IS",eol,eol);
    uiapWriteTextFile(fvhd," SIGNAL state : BIT_VECTOR(",misrSize-1, " DOWNTO 0);",eol);
    uiapWriteTextFile(fvhd,"BEGIN",eol);
    uiapWriteTextFile(fvhd," PROCESS (cp, cdn)",eol);
    uiapWriteTextFile(fvhd," BEGIN",eol);
    uiapWriteTextFile(fvhd,"   IF (cdn = '0') THEN",eol);
    uiapWriteTextFile(fvhd,"      state(0) <= '1';",eol);
    uiapWriteTextFile(fvhd,"      state(",misrSize-1," DOWNTO 1) <= ItoBV(0,",misrSize-1,");",eol);
    uiapWriteTextFile(fvhd,"   ELSIF (cp'event AND cp = '1') THEN",eol);

inputcount := 1;
    for polycount:= 0 upto misrSize-2  dob
      if polycount = 0 then
      begin
        uiapWriteTextFile(fvhd,"      state(",misrSize-1-polycount,") <= state(0) XOR ramout(0);",eol);
        continue;
      end else
      if misrPoly[polycount] then
      begin
        uiapWriteTextFile(fvhd,"      state(",misrSize-1-polycount,") <= state(0) XOR state(",misrSize-1-polycount+1,")");
        if inputcount <dbits then
        begin
          uiapWriteTextFile(fvhd," XOR ramout(",inputcount,");",eol);
          inputcount := inputcount +1;
        end
        else
        begin
          uiapWriteTextFile(fvhd,";",eol);
          inputcount := inputcount +1;
        end;
```

```
       end else
       if NOT(misrPoly[polycount]) AND inputcount < dbits then
       begin
           uiapWriteTextFile(fvhd,"      state(",misrSize-1-polycount,") <=
 5     state(",misrSize-1-polycount+1,
                                                          ") XOR
       ramout(",inputcount,");",eol);
           inputcount := inputcount +1;
       end else
10     begin
           uiapWriteTextFile(fvhd,"      state(",misrSize-1-polycount,") <=
       state(",misrSize-1-polycount+1,");",eol);
       end;
     end;
15   if dbits < misrSize then
         uiapWriteTextFile(fvhd,"      state(",0,") <= state(",1,");",eol)
     else
     if dbits = misrSize then
         uiapWriteTextFile(fvhd,"      state(",0,") <= state(",1,") XOR
20   ramout(",dbits-1,");",eol);
     uiapWriteTextFile(fvhd,"    END IF;",eol);
     uiapWriteTextFile(fvhd," END PROCESS;",eol);
     uiapWriteTextFile(fvhd," signature <= state;",eol);
     uiapWriteTextFile(fvhd,"END synth;",eol);
25   pman.cellHasBeenWritten (filename,vhdType,fvhd);
     return(TRUE);
   end;

30 boolean procedure makeBIST ( string mname;
     integer abits;
     integer dbits;
35   integer misrSize;

);

begin
40
     string filename,msg;
     pointer (textfile) fvhd;
     integer count;
     string addC, contC, compC, misrC, initC;
45
     addC := contC := compC := misrC := initC := "";

filename :=msg := "";

50   write(filename,mname,"_top_BIST",misrSize);

fvhd := pman.openCellForWriting(filename, vhdType);
     if NOT fvhd thenb
        write (msg,"ERROR, Unable to Open the File [vhd]",filename,eol);
55      uiapRequestPostMessage(msg);
        return(false);
     end;

headerMsg(fvhd,filename,"BIST TOP LEVEL");
60   generateHeader(fvhd);
```

```
    uiapWriteTextFile(fvhd,"ENTITY ",filename," IS",eol);
    uiapWriteTextFile(fvhd," PORT (testclock  : IN BIT;",eol);
    uiapWriteTextFile(fvhd,"       testmode   : IN BIT;",eol);
    uiapWriteTextFile(fvhd,"       endoftest  : OUT BIT;",eol);
    uiapWriteTextFile(fvhd,"       testresult1 : OUT BIT;",eol);
    uiapWriteTextFile(fvhd,"       testresult2 : OUT BIT;",eol);
    uiapWriteTextFile(fvhd,"       sysaddr    : IN BIT_VECTOR(",abits-1," DOWNTO
 0);",eol);
    uiapWriteTextFile(fvhd,"       syswen     : IN BIT;",eol);
    uiapWriteTextFile(fvhd,"       syscen     : IN BIT;",eol);
    uiapWriteTextFile(fvhd,"       ramaddr    : OUT BIT_VECTOR(",abits-1," DOWNTO
 0);",eol);
    uiapWriteTextFile(fvhd,"       ramwen     : OUT BIT;",eol);
    uiapWriteTextFile(fvhd,"       ramcen     : OUT BIT;",eol);
    uiapWriteTextFile(fvhd,"       sysoen     : IN BIT;",eol);
    uiapWriteTextFile(fvhd,"       ramoen     : OUT BIT;",eol);
    uiapWriteTextFile(fvhd,"       sysdatain  : IN BIT_VECTOR(",dbits-1," DOWNTC
 0);",eol);
    uiapWriteTextFile(fvhd,"       ramdataout : IN BIT_VECTOR(",dbits-1," DOWNTC
 0);",eol);
    uiapWriteTextFile(fvhd,"       ramdatain  : OUT BIT_VECTOR(",dbits-1," DOWNT
 0)",eol);
    uiapWriteTextFile(fvhd,"       );",eol);
    uiapWriteTextFile(fvhd,"END ",filename,";",eol);

uiapWriteTextFile(fvhd,"ARCHITECTURE synth OF ",filename," IS",eol);

write (addC,mname,"_addgen",abits);

Component Address Generator uiapWriteTextFile(fvhd,"COMPONENT ",addC,eol,eol);
    uiapWriteTextFile(fvhd," PORT (cdn, cp  : IN BIT;",eol);
    uiapWriteTextFile(fvhd,"       qout, qoutn : OUT BIT_VECTOR (",abits-1," DOW
 0);",eol);
    uiapWriteTextFile(fvhd,"       testmodecarry : OUT BIT",eol);
    uiapWriteTextFile(fvhd,"       );",eol);
    uiapWriteTextFile(fvhd,"END COMPONENT;",eol,eol);

Component Control Unit write (contC,mname,"_control",dbits);
    uiapWriteTextFile(fvhd,"COMPONENT ",contC,eol,eol);
    uiapWriteTextFile(fvhd," PORT (cdn, cp  : IN BIT;",eol);
    uiapWriteTextFile(fvhd,"       endoftest      : OUT BIT;",eol);
    uiapWriteTextFile(fvhd,"             invertaddress   : OUT BIT;",eol);
    uiapWriteTextFile(fvhd,"             ramdata         : OUT BIT_VECTOR(",dbi
 1,
                                                         " DOWNTO 0);",eol);
    uiapWriteTextFile(fvhd,"             readwriten      : OUT BIT;",eol);
    uiapWriteTextFile(fvhd,"             signatureclk    : OUT BIT;",eol);
    uiapWriteTextFile(fvhd,"             stimulusclk     : OUT BIT;",eol);
    uiapWriteTextFile(fvhd,"             testmodecarryin : IN BIT",eol);
    uiapWriteTextFile(fvhd,"             );",eol);

uiapWriteTextFile(fvhd,"END COMPONENT;",eol,eol);

Component Compare unit write (compC, mname,"_compare",misrSize);

uiapWriteTextFile(fvhd,"COMPONENT ",compC,eol,eol);
```

```
    uiapWriteTextFile(fvhd,"        PORT (in1      : IN BIT_VECTOR (",misrSize-1,
    DOWNTO 0);",eol);
    uiapWriteTextFile(fvhd,"              in2      : IN BIT_VECTOR (",misrSize-1,
    DOWNTO 0);",eol);
    uiapWriteTextFile(fvhd,"              out1     : OUT BIT;",eol);
    uiapWriteTextFile(fvhd,"              out2     : OUT BIT",eol);
    uiapWriteTextFile(fvhd,"              );",eol);
    uiapWriteTextFile(fvhd,"END COMPONENT;",eol,eol);

# Component MISR
    write (misrC,mname,"_misr",misrSize);
    uiapWriteTextFile(fvhd,"COMPONENT ",misrC,eol,eol);
    uiapWriteTextFile(fvhd,"        PORT ( cdn, cp  : IN BIT;",eol);
    uiapWriteTextFile(fvhd,"               ramout  : IN BIT_VECTOR (",dbits-1,"
    DOWNTO 0);",eol);
    uiapWriteTextFile(fvhd,"               signature: OUT BIT_VECTOR (",misrSize-1
    DOWNTO 0)",eol);
    uiapWriteTextFile(fvhd,"              );",eol);
    uiapWriteTextFile(fvhd,"END COMPONENT;",eol,eol);

Component init write(initC,mname,"_init");

uiapWriteTextFile(fvhd,"COMPONENT ",initC,eol,eol);
    uiapWriteTextFile(fvhd,"        PORT (cp        : IN BIT;",eol);
    uiapWriteTextFile(fvhd,"              testmode  : IN BIT;",eol);
    uiapWriteTextFile(fvhd,"              init      : OUT BIT",eol);
    uiapWriteTextFile(fvhd,"              );",eol);
    uiapWriteTextFile(fvhd,"END COMPONENT;",eol,eol);

uiapWriteTextFile(fvhd," SIGNAL addr   : BIT_VECTOR(",abits-1," DOWNTO
    0);",eol);
    uiapWriteTextFile(fvhd," SIGNAL initn, c_invadd, c_rw   : BIT;",eol);
    uiapWriteTextFile(fvhd," SIGNAL c_ramdata : BIT_VECTOR(",dbits-1," DOWNTO
    0);",eol);
    uiapWriteTextFile(fvhd," SIGNAL c_sigclk, c_sticlk, c_tmci : BIT;",eol);
    uiapWriteTextFile(fvhd," SIGNAL m_sig   : BIT_VECTOR(",misrSize-1," DOWNTO
    0);",eol);
    uiapWriteTextFile(fvhd," SIGNAL a_qout, a_qoutn   : BIT_VECTOR(",abits-1,"
    DOWNTO 0);",eol);
    uiapWriteTextFile(fvhd,"BEGIN",eol,eol);

uiapWriteTextFile(fvhd,"initlogic : ",initC," PORT MAP",eol);
    uiapWriteTextFile(fvhd,"    (testclock, testmode, initn);",eol,eol);

uiapWriteTextFile(fvhd,"control : ",contC," PORT MAP",eol);
    uiapWriteTextFile(fvhd,"    (initn, testclock, endoftest, c_invadd,",eol);
    uiapWriteTextFile(fvhd,"     c_ramdata, c_rw, c_sigclk, c_sticlk,
    c_tmci);",eol,eol);

uiapWriteTextFile(fvhd,"misr : ",misrC," PORT MAP",eol);
    uiapWriteTextFile(fvhd,"    (initn, c_sigclk, ramdataout, m_sig);",eol,eol);

uiapWriteTextFile(fvhd,"compare : ",compC," PORT MAP",eol);
    uiapWriteTextFile(fvhd,"    (m_sig, m_sig, testresult1, testresult2
    );",eol,eol);

uiapWriteTextFile(fvhd,"addgen : ",addC," PORT MAP",eol);
    uiapWriteTextFile(fvhd,"    (initn, c_sticlk, a_qout, a_qoutn,
    c_tmci);",eol,eol);
```

```
    uiapWriteTextFile(fvhd," PROCESS(c_invadd,a_qout, a_qoutn)",eol);
    uiapWriteTextFile(fvhd," BEGIN",eol);
    uiapWriteTextFile(fvhd,"    IF c_invadd = '0' THEN",eol);
    uiapWriteTextFile(fvhd,"       addr <= a_qout;",eol);
    uiapWriteTextFile(fvhd,"    ELSIF c_invadd = '1' THEN",eol);
    uiapWriteTextFile(fvhd,"       addr <= a_qoutn;",eol);
    uiapWriteTextFile(fvhd,"    END IF;",eol);
    uiapWriteTextFile(fvhd," END PROCESS;",eol,eol);

uiapWriteTextFile(fvhd," PROCESS(testmode, sysaddr, syswen, sysoen, syscen, sysdatain,",eol);
    uiapWriteTextFile(fvhd,"         addr, c_rw, testclock, c_ramdata)",eol);
    uiapWriteTextFile(fvhd," BEGIN",eol);
    uiapWriteTextFile(fvhd,"    IF (testmode = '1') THEN",eol);
    uiapWriteTextFile(fvhd,"       ramaddr   <= addr;",eol);
    uiapWriteTextFile(fvhd,"       ramwen    <= c_rw;",eol);
    uiapWriteTextFile(fvhd,"       ramoen    <= NOT(c_rw);",eol);
    uiapWriteTextFile(fvhd,"       ramcen    <= testclock;",eol);
    uiapWriteTextFile(fvhd,"       ramdatain <= c_ramdata;",eol);
    uiapWriteTextFile(fvhd,"    ELSIF (testmode = '0') THEN",eol);
    uiapWriteTextFile(fvhd,"       ramaddr   <= sysaddr;",eol);
    uiapWriteTextFile(fvhd,"       ramwen    <= syswen;",eol);
    uiapWriteTextFile(fvhd,"       ramoen    <= sysoen;",eol);
    uiapWriteTextFile(fvhd,"       ramcen    <= syscen;",eol);
    uiapWriteTextFile(fvhd,"       ramdatain <= sysdatain;",eol);
    uiapWriteTextFile(fvhd,"    END IF;",eol);
    uiapWriteTextFile(fvhd," END PROCESS;",eol,eol);
    uiapWriteTextFile(fvhd,"END synth;",eol);

pman.cellHasBeenWritten (filename,vhdType,fvhd);
    return(TRUE);
end;

boolean procedure makeVHDLBist ( pointer (bitoptBistramInfo)
         bistramInfo;           # info on the BISTRAM (and RAM)
);

begin integer dataBits, addressBits;
    integer misrSize;
    boolean array (0 to *) poly, sigarray;
    integer myRamType;
    boolean typeIO;
    string  signature;
    string  bistramName;
    pointer(bistUtilitiesInt) myBitutl;

pointer (bitoptRamInfo) ramInfo;
    ramInfo := bistRamInfo.ramInfo;

addressBits := ramInfo.ramAddrBits;
```

```
       dataBits    := ramInfo.ramDataBits;
       myRamType   := ramInfo.ramType;
       typeIO      := ramInfo.ramIosep;

5     misrSize    := bistramInfo.signatureSizeBits;
       myBitutl:= pmrim.newCell("bitutl", rimType);
       if NOT myBitutl.getLFSRpolynomial (misrSize, poly) thenb
          uiapRequestPostmessage ("ERROR: Unable to get the LFSR Polynomial",eol);
          return (FALSE);
10     end;
       signature := myBitutl.bitutlGetRAMsignature (bistramInfo);
       myBitutl.bitutlGetBinaryString (signature, sigarray);
       bistramName := bistramInfo.bistramPclname;
       dispose(myBitutl);
15     # Some Error Checking here

# Now the main procedures
       uiapRequestPostMessage("Info: Making VHDL Bist",eol);

20     if NOT makeAddressGenerator (bistramName, addressBits) then
           return(FALSE);
       if NOT makeInitGen (bistramName) then
         return(FALSE);

25     if NOT makeControlGenerator (bistramName, dataBits) then
           return(FALSE);

if NOT makeCOMP (bistramName, misrSize,sigarray) then
           return(FALSE);
30
       if NOT makeMISR (bistramName,dataBits,misrSize,poly) then
           return(FALSE);

if NOT makeBIST (bistramName,addressBits,dataBits,misrSize) thenb
35        uiapRequestPostMessage("ERROR: Unable to finish generating one or more VHI
    modules",eol);
          return(FALSE);
       end;
       return(TRUE);
40
    end;

45
    end "bitvhd"
```

APPENDIX D: BITOPT.MSI

```
# bitopt.msi / BIST compilers option checker

# Module bitopt.ms verifies that the options of RAM, ROM, Mult are
# supported by the corresponding BIST compiler. It also return the
# RAM (ROM, Mult) compiler prefix of the PCL parameters.

define unknownRamType   = 0,
       cram01Type       = 1,
       cram02Type       = 2,
       cram03Type       = 3,
       vgtramType       = 4,
       sramType         = 5,
       dpramType        = 6,
       vcc4rs1Type      = 7,
       vgrs02Type       = 8,
       rs2Type          = 9,
       vgc4rs1Type      = 10,
       rs21Type         = 11,
       vgc6rs1Type      = 12,
       cram03aType      = 13,
       ccl6ra3Type      = 14;

define unknownRomType   = 0,
       crom01Type       = 1,
       crom02Type       = 2,
       tcrom021Type     = 3;
define unknownMultType  = 0,
       cmlt01Type       = 1,
       cmlt02Type       = 2,
       vmlt03Type       = 3;
# define the possible dpram configurations
#-------------------------------------------
define dpramLeqR        = 0,   # size(ALbus) = size(ARbus)
       dpramAHIL        = 1,   # size(ALbus) = 2*size(ARbus)
       dpramAHIR        = 2;   # size(ARbus) = 2*size(ALbus)

# define constants for the BISTRAM options
#-------------------------------------------
define # ram pcl file name
       bistramRamPclParamName              = "BISTRAM_ram_pcl_file",
       # test result options
       bistramTestResultParamName          = "BISTRAM_test_result",
       bistramTestResultFlag               = "FLAG",
       bistramTestResultScan               = "SCAN",
       bistramTestResultSignature          = "SIGNATURE",
       bistramTestResultFlagOption         = 1,
       bistramTestResultScanOption         = 2,
       bistramTestResultSignatureOption    = 3,
       # bist analyzis
       bistramAnalyzisParamName            = "BISTRAM_analysis",
       bistramSignatureAnalyzis            = "SIGNATURE",
       bistramCompareAnalyzis              = "COMPARE",
       bistramSignatureAnalyzisOption      = 1,
       bistramCompareAnalyzisOption        = 2,
       # init pin option
       bistramInitPinParamName             = "BISTRAM_init_pin";
```

```
        # define constants for the BISTROM options
        #------------------------------------
        define # rom pcl file name
               bistromRomPclParamName            = "BISTROM_rom_pcl_file",
               # optimization options
               bistromOptimizationParamName      = "BISTROM_optimization",
               bistromOptimizationMinArea        = "MIN_AREA",
               bistromOptimizationMinTestCycles  = "MIN_TEST_CYCLES",
               bistromOptimMinAreaOption         = 1,
               bistromOptimMinTestCyclesOption   = 2,
               # test result options
               bistromTestResultParamName        = "BISTROM_test_result",
               bistromTestResultFlag             = "FLAG",
               bistromTestResultScan             = "SCAN",
               bistromTestResultSignature        = "SIGNATURE",
               bistromTestResultFlagOption       = 1,
               bistromTestResultScanOption       = 2,
               bistromTestResultSignatureOption  = 3,
               # init pin option
               bistromInitPinParamName           = "BISTROM_init_pin";

# define constants for the BISTMULT options
        #------------------------------------
        define # mult pcl file name
               bistmultMultPclParamName          = "BISTMULT_mult_pcl_file",
               # fault coverage option
               bistmultFaultCoverParamName       = "BISTMULT_fault_coverage",
               bistmultFaultCoverStandard        = "STANDARD",
               bistmultFaultCoverExtended        = "EXTENDED",
               bistmultFaultCoverStandardOption  = 1,
               bistmultFaultCoverExtendedOption  = 2,
               # optimization options
               bistmultOptimizationParamName     = "BISTMULT_optimization",
               bistmultOptimizationMinArea       = "MIN_AREA",
               bistmultOptimizationMinTestCycles = "MIN_TEST_CYCLES",
               bistmultOptimMinAreaOption        = 1,
               bistmultOptimMinTestCyclesOption  = 2,
               # test result options
               bistmultTestResultParamName       = "BISTMULT_test_result",
               bistmultTestResultFlag            = "FLAG",
               bistmultTestResultScan            = "SCAN",
               bistmultTestResultSignature       = "SIGNATURE",
               bistmultTestResultFlagOption      = 1,
               bistmultTestResultScanOption      = 2,
               bistmultTestResultSignatureOption = 3,
               # init pin option
               bistmultInitPinParamName          = "BISTMULT_init_pin";

# define common bist constants
        #------------------------------------
        define minimumSignatureSize              = 16 ,
               maxBitsFor1clockPerSign           = 21,
               maxBitsFor2clockPerSign           = 41,
               maxBitsFor3clockPerSign           = 49,
               maxSignatureSize                  = 64;

#---------------------------------------------------------------------------
        # class common to all BISTs
        #---------------------------------------------------------------------------
        class bitoptBistInfo (
         integer signatureSizeBits, # size of the signature analyzer
```

```
            signatureSizeMsb,     # msb of signatureSizeBits
            signatureInputBits,   # nb of bits of the signature inputs
            signatureInputMsb,    # msb of signatureInputBits
            testLength;           # length of the test of the RAM
    boolean boundaryScanBist;     # true if the BIST is configured
                                  # for boundary scan (testResult is
                                  # scan and initPin is false)
    string  signature;            # signature at the end of test
);

#--------------------------------------------------------------------
# class of the RAM info needed when creating a BISTRAM
#--------------------------------------------------------------------
class bitoptRamInfo (
    string  ramPclName;           # PCL name of the RAM
    integer ramType,              # ram compiler name
            ramDataBits,          # number of RAM data IOs
            ramDataIOmsb,         # msb of the number of RAM data IOs
            ramDepth,             # width of the RAM
            ramAddrBits,          # number of RAM addresses
            ramAddrMsb,           # msb of the RAM addresses
            ramBalanceData,       # number of dataIO div by 8
            ramDualPortHI;        # dpram: dpramAHIL : size(ALbus) = 2*size(ARbus)
                                  #        dpramAHIR : size(ARbus) = 2*size(ALbus)
                                  #        dpramLeqR : size(ALbus) = size(ARbus)
    boolean ramIoSep,             # TRUE if IOs are separated
            ramCEconn,            # TRUE if CE connector exists (CEB always exists)
            ramOEconn,            # TRUE if OE connector exists
            ramAddrIsNotPower2;   # TRUE if the number of addresses is not a power
                                  # of 2
);

#--------------------------------------------------------------------
# class of the BISTRAM info
#--------------------------------------------------------------------
class (bitoptBistInfo) bitoptBistramInfo (
    string                  bistramPclName;    # PCL name of the BISTRAM
    pointer (bitoptRamInfo) ramInfo;           # info on the RAM
    integer                 bistramAnalyzis,   # bist analyzis(compare, signature
                            bistramTestResult; # test result option
    boolean                 bistramInitPin;    # true if INITIALIZEN pin exists
);

#--------------------------------------------------------------------
# class of the ROM info needed when creating a BISTROM
#--------------------------------------------------------------------
class bitoptRomInfo (
    string  romPclName,           # PCL name of the ROM
            romCodeFile;          # code file for the ROM
    integer romType,              # rom compiler name
            romDataBits,          # number of the ROM data
            romDataMsb,           # msb of the number of ROM data
            romDepth,             # depth of the ROM
            romAddrBits,          # number of address bits of the ROM
            romAddrMsb,           # msb of the number of address bits of the ROM
            romNumOfColumns;      # number of columns of the ROM
    boolean romAddrIsPower2;      # TRUE if the number of addresses is a power of 2
);

#--------------------------------------------------------------------
# class of the BISTROM info
```

```
#---------------------------------------------------------------
class (bitoptBistInfo) bitoptBistromInfo (
  string                    bistromPclName;      # PCL name of the BISTROM
  pointer (bitoptRomInfo)   romInfo;             # info on the ROM
  integer                   bistromOptimization,# bist optimization(min area,..)
                            bistromTestResult,   # test result option
                            nbOfClkPerSign;      # number of clock cylce to compac
                                                 # one ROM data
  boolean                   bistromInitPin;      # true if INITIALIZEN pin exists
);

#---------------------------------------------------------------
# class of the MULTIPLIER info needed when creating a BISTMULT
#---------------------------------------------------------------
class bitoptMultInfo (
  string    multPclName;    # PCL name of the multiplier
  integer   multType,       # multiplier compiler name
            multAbits,      # number of A bits of the multiplier
            multAmsb,       # msb of the number of A bits of the multiplier
            multBbits,      # number of B bits of the multiplier
            multBmsb;       # msb of the number of B bits of the multiplier
);

#---------------------------------------------------------------
# class of the BISTMULT info
#---------------------------------------------------------------
class (bitoptBistInfo) bitoptBistmultInfo (
  string                    bistmultPclName;     # PCL name of the BISTROM
  pointer (bitoptMultInfo)  multInfo;            # info on the ROM
  integer                   bistmultFaultCover, # fault coverage option
                            bistmultOptimization,# bist optimization(min area,..)
                            bistmultTestResult,  # test result option
                            nbOfClkPerSign;      # number of clock cycles to
                                                 # compact one ROM data
  boolean                   bistmultInitPin;     # true if INITIALIZEN pin exists
);

#---------------------------------------------------------------
# bitopt module class
#---------------------------------------------------------------
class bitoptInt( boolean
procedure getBistramInfoAndCheck (
 modifies pointer (bitoptBistramInfo) bistramInfo;
);

boolean
procedure getBistromInfoAndCheck (
 modifies pointer (bitoptBistromInfo) bistromInfo;
);

boolean
procedure getBistmultInfoAndCheck (
 modifies pointer (bitoptBistmultInfo) bistmultInfo;
);

boolean
procedure searchPathIsOkForBist;
```

```
    boolean
    procedure checkPclVersion (
      pointer(parameterCellImpInt)  pcl;
      optional boolean promptPcl;
5   );

); # class bitoptInt
```

APPENDIX E : BIST_DATA_ADDGEN6

```
--------------------------------------------------
--       [COMPASS DESIGN AUTOMATION]            --
--                                              --
--                                              --
--            VHDL BIST MODULE                  --
--                                              --
--              Generated By                    --
--                                              --
--            VHDL BIST GENERATOR               --
--------------------------------------------------
-- Module Name :bist_data_addgen6.vhd
-- Module Type :BIST ADDRESS GENERATOR
Library ieee;
Library COMPASS_LIB;
USE ieee.STD_Logic_1164.ALL;
USE COMPASS_LIB.COMPASS.ALL;

ENTITY bist_data_addgen6 IS

PORT ( cdn, cp  : IN BIT;
         qout, qoutn : OUT BIT_VECTOR (5 DOWNTO 0);
         testmodecarry : OUT BIT
       );
END bist_data_addgen6;

ARCHITECTURE synth OF bist_data_addgen6 IS
  SIGNAL value : INTEGER range 0 to 63;
BEGIN PROCESS(cp, cdn)
  BEGIN
    IF (cdn = '0') THEN
      value <= 0;
    ELSIF (cp'event AND cp = '1') THEN
    IF (value >=63) THEN
      value <=0;
    ELSE
      value <= value + 1;
    END IF;
    END IF;
  END PROCESS;

qout <= ItoBV(value,6);
  qoutn <= NOT(ItoBV(value,6));
  testmodecarry <= reduce_and(ItoBV(value,6));

END synth;
```

APPENDIX F: BIST_DATA_COMPARE16

```
-------------------------------------------------
--          [COMPASS DESIGN AUTOMATION]          --
--                                               --
--                                               --
--              VHDL BIST MODULE                 --
--                                               --
--                 Generated By                  --
--                                               --
--              VHDL BIST GENERATOR              --
-------------------------------------------------
-- Module Name :bist_data_compare16.vhd
-- Module Type :BIST SIGNATURE COMPARATOR
Library ieee;
Library COMPASS_LIB;
USE ieee.STD_Logic_1164.ALL;
USE COMPASS_LIB.COMPASS.ALL;
ENTITY bist_data_compare16 IS
  PORT (in1 : IN BIT_VECTOR (15 DOWNTO 0);
        in2 : IN BIT_VECTOR (15 DOWNTO 0);
     out1 : OUT BIT;
     out2 : OUT BIT
     );
END bist_data_compare16;
ARCHITECTURE synth OF bist_data_compare16 IS
BEGIN
  PROCESS(in1,out1)
  BEGIN
    IF (in1 = "1111111110011110") THEN
      out1 <= '1';
    ELSE
      out1 <= '0';
    END IF;
  END PROCESS;

PROCESS(in2,out2)
     BEGIN
       IF (in2 ="1111111110011110") THEN
         out2 <= '1';
       ELSE
         out2 <= '0';
       END IF;
     END PROCESS;
END synth;
```

APPENDIX G: BIST_DATA_CONTROL8.VHD

```vhdl
---------------------------------------------
--          [COMPASS DESIGN AUTOMATION]     --
--                                          --
--                                          --
--              VHDL BIST MODULE            --
--                                          --
--                Generated By              --
--                                          --
--              VHDL BIST GENERATOR         --
---------------------------------------------
-- Module Name :bist_data_control8.vhd
-- Module Type :BIST CONTROL SIGNAL GENERATOR
Library ieee;
Library COMPASS_LIB;
USE ieee.STD_Logic_1164.ALL;
USE COMPASS_LIB.COMPASS.ALL;
ENTITY bist_data_control8 IS
  PORT (cdn, cp  : IN BIT;
        endoftest : OUT BIT;
        invertaddress : OUT BIT;
        ramdata   : OUT BIT_VECTOR(7 DOWNTO 0);
        readwriten : OUT BIT;
        signatureclk : OUT BIT;
        stimulusclk : OUT BIT;
        testmodecarryin : IN BIT
       );
END bist_data_control8;
ARCHITECTURE synth OF bist_data_control8 IS SIGNAL counter : INTEGER range 0 to 3;
  SIGNAL eot, sigclk, sitclk, rwn, data : BIT;

BEGIN
  PROCESS (cp, cdn)
  BEGIN
    IF (cdn = '0') THEN
      sigclk <= '0';
      sitclk <= '0';
      rwn    <= '0';
      data   <= '0';
    ELSIF (cp'event AND cp = '1') THEN
      IF (counter = 0 AND eot = '0') THEN
        sitclk <= NOT(sitclk);
        sigclk <= '0';
        rwn    <= '0';
        data   <= '0';
        IF (testmodecarryin = '1') THEN
          rwn <= '1';
        END IF;
      ELSIF (counter = 1 AND eot = '0') THEN
        sitclk <= NOT(sitclk);
        sigclk <= NOT(sigclk);
        rwn    <= NOT(rwn);
        data   <= NOT(data);
        IF (testmodecarryin = '1') THEN
          data <= '1';
        END IF;
      ELSIF (counter = 2 AND eot = '0') THEN
```

```
            sitclk <= NOT(sitclk);
            sigclk <= NOT(sigclk);
            rwn    <= NOT(rwn);
            data   <= NOT(data);
          ELSIF (counter = 3 AND eot = '0') THEN
            sitclk <= NOT(sitclk);
            sigclk <= NOT(sigclk);
            rwn    <= '1';
            data   <= '0';
          END IF;
       END IF;
    END PROCESS;

PROCESS (sitclk, cdn)
    BEGIN
       IF (cdn = '0') THEN
          counter <= 0;
          eot     <= '0';
       ELSIF (sitclk'event AND sitclk = '1') THEN
          IF (testmodecarryin = '1') THEN
             counter <= counter +1;
             IF (counter >= 3) THEN
                counter <= 0;
                eot     <= '1';
             END IF;
          END IF;
       END IF;
    END PROCESS;

PROCESS(counter, invertaddress)

VARIABLE mycount : BIT_VECTOR(1 DOWNTO 0);
    BEGIN
       mycount := ItoBV(counter,2);
       invertaddress <= mycount(1);
    END PROCESS;

stimulusclk  <= sitclk;
    signatureclk <= sigclk;
    readwriten   <= rwn;
    endoftest    <= eot;
    ramdata(0)   <= NOT(data);
    ramdata(1)   <= data;
    ramdata(2)   <= NOT(data);
    ramdata(3)   <= data;
    ramdata(4)   <= NOT(data);
    ramdata(5)   <= data;
    ramdata(6)   <= NOT(data);
    ramdata(7)   <= data;
 END synth;
```

APPENDIX H: BIST_DATA_INIT

```
----------------------------------------
--       [COMPASS DESIGN AUTOMATION]   --
--                                     --
--                                     --
--          VHDL BIST MODULE           --
--                                     --
--             Generated By            --
--                                     --
--          VHDL BIST GENERATOR        --
----------------------------------------
-- Module Name :bist_data_init.vhd
-- Module Type :BIST INIT SIGNAL GENERATOR
Library ieee;
Library COMPASS_LIB;
USE ieee.STD_Logic_1164.ALL;
USE COMPASS_LIB.COMPASS.ALL;
ENTITY bist_data_init IS
  PORT (cp : IN BIT;
        testmode : IN BIT;
        init : OUT BIT
       );
END bist_data_init;

ARCHITECTURE synth OF bist_data_init IS

SIGNAL flag : BIT;
BEGIN
  PROCESS (cp)
  BEGIN
    IF (cp'event AND cp = '1') THEN
      IF testmode = '0' THEN
        flag <= '1';
      ELSIF testmode = '1' THEN
        flag <= '0';
      END IF;
    END IF;
  END PROCESS;

PROCESS (cp)
  BEGIN
    IF (cp'event AND cp = '0') THEN
      IF (testmode = '0') THEN
        init <= '1';
      ELSIF (testmode = '1' AND flag = '1') THEN
        init <= '0';
      ELSIF (testmode = '1' AND flag = '0') THEN
        init <= '1';
      END IF;
    END IF;
  END PROCESS;
END synth;
```

APPENDIX I: BIST_DATA_MISR16

```
-- INPUT MISR POLY : 000001001000001
-- NEW MISR POLY : 010000010010000
------------------------------------------
--          [COMPASS DESIGN AUTOMATION]       --
--                                            --
--                                            --
--              VHDL BIST MODULE              --
--                                            --
--                 Generated By               --
--                                            --
--              VHDL BIST GENERATOR           --
------------------------------------------
-- Module Name :bist_data_misr16.vhd
-- Module Type :BIST MISR
Library ieee;
Library COMPASS_LIB;
USE ieee.STD_Logic_1164.ALL;
USE COMPASS_LIB.COMPASS.ALL;
ENTITY bist_data_misr16 IS
  PORT ( cdn, cp : IN BIT;
         ramout : IN BIT_VECTOR (7 DOWNTO 0);
         signature: OUT BIT_VECTOR (15 DOWNTO 0)
       );
END bist_data_misr16;

ARCHITECTURE synth OF bist_data_misr16 IS

SIGNAL state : BIT_VECTOR(15 DOWNTO 0);
BEGIN
  PROCESS (cp, cdn)
  BEGIN
    IF (cdn = '0') THEN
       state(0) <= '1';
       state(15 DOWNTO 1) <= ItoBV(0,15);
    ELSIF (cp'event AND cp = '1') THEN
       state(15) <= state(0) XOR ramout(0);
       state(14) <= state(0) XOR state(15) XOR ramout(1);
       state(13) <= state(14) XOR ramout(2);
       state(12) <= state(13) XOR ramout(3);
       state(11) <= state(12) XOR ramout(4);
       state(10) <= state(11) XOR ramout(5);
       state(9)  <= state(10) XOR ramout(6);
       state(8)  <= state(0) XOR state(9) XOR ramout(7);
       state(7)  <= state(8);
       state(6)  <= state(7);
       state(5)  <= state(0) XOR state(6);
       state(4)  <= state(5);
       state(3)  <= state(4);
       state(2)  <= state(3);
       state(1)  <= state(2);
       state(0)  <= state(1);
    END IF;
  END PROCESS;
  signature <= state;
END synth;
```

APPENDIX J: BIST_DATA_TOP_BIST16

```
------------------------------------------
--          [COMPASS DESIGN AUTOMATION]          --
--                                               --
--                                               --
--              VHDL BIST MODULE                 --
--                                               --
--                 Generated By                  --
--                                               --
--            VHDL BIST GENERATOR                --
------------------------------------------
-- Module Name :bist_data_top_BIST16.vhd
-- Module Type :BIST TOP LEVEL
Library ieee;
Library COMPASS_LIB;
USE ieee.STD_Logic_1164.ALL;
USE COMPASS_LIB.COMPASS.ALL;
ENTITY bist_data_top_BIST16 IS
  PORT (testclock  : IN BIT;
        testmode   : IN BIT;
        endoftest  : OUT BIT;
        testresult1 : OUT BIT;
        testresult2 : OUT BIT;
        sysaddr    : IN BIT_VECTOR(5 DOWNTO 0);
        syswen     : IN BIT;
        syscen     : IN BIT;
        ramaddr    : OUT BIT_VECTOR(5 DOWNTO 0);
        ramwen     : OUT BIT;
        ramcen     : OUT BIT;
        sysoen     : IN BIT;
        ramoen     : OUT BIT;
        sysdatain  : IN BIT_VECTOR(7 DOWNTO 0);
        ramdataout : IN BIT_VECTOR(7 DOWNTO 0);
        ramdatain  : OUT BIT_VECTOR(7 DOWNTO 0)
       );
END bist_data_top_BIST16;
ARCHITECTURE synth OF bist_data_top_BIST16 IS
COMPONENT bist_data_addgen6

PORT (cdn, cp : IN BIT;
        qout, qoutn : OUT BIT_VECTOR (5 DOWNTO 0);
        testmodecarry : OUT BIT
       );
END COMPONENT;

COMPONENT bist_data_control8

PORT (cdn, cp : IN BIT;
        endoftest    : OUT BIT;
            invertaddress    : OUT BIT;
            ramdata          : OUT BIT_VECTOR(7 DOWNTO 0);
            readwriten       : OUT BIT;
            signatureclk     : OUT BIT;
            stimulusclk      : OUT BIT;
            testmodecarryin  : IN BIT
           );
END COMPONENT;

COMPONENT bist_data_compare16
```

```
        PORT (in1      : IN BIT_VECTOR (15 DOWNTO 0);
              in2      : IN BIT_VECTOR (15 DOWNTO 0);
              out1     : OUT BIT;
              out2     : OUT BIT
             );
    END COMPONENT;

COMPONENT bist_data_misr16

PORT ( cdn, cp  : IN BIT;
               ramout   : IN BIT_VECTOR (7 DOWNTO 0);
               signature: OUT BIT_VECTOR (15 DOWNTO 0)
              );
    END COMPONENT;

COMPONENT bist_data_init

PORT (cp        : IN BIT;
              testmode  : IN BIT;
              init      : OUT BIT
             );
    END COMPONENT;

SIGNAL addr    : BIT_VECTOR(5 DOWNTO 0);
    SIGNAL initn, c_invadd, c_rw     : BIT;
    SIGNAL c_ramdata  : BIT_VECTOR(7 DOWNTO 0);
    SIGNAL c_sigclk, c_stilk, c_tmci : BIT;
    SIGNAL m_sig   : BIT_VECTOR(15 DOWNTO 0);
    SIGNAL a_qout, a_qoutn  : BIT_VECTOR(5 DOWNTO 0);
  BEGIN initlogic : bist_data_init  PORT MAP
       (testclock, testmode, initn);

control : bist_data_control8 PORT MAP
       (initn, testclock, endoftest, c_invadd,
        c_ramdata, c_rw, c_sigclk, c_stilk, c_tmci);

misr   : bist_data_misr16 PORT MAP
       (initn, c_sigclk, ramdataout, m_sig);

compare : bist_data_compare16 PORT MAP
       (m_sig, m_sig, testresult1, testresult2 );

addgen : bist_data_addgen6 PORT MAP
       (initn, c_stilk, a_qout, a_qoutn, c_tmci);

PROCESS(c_invadd,a_qout, a_qoutn)
   BEGIN
     IF c_invadd = '0' THEN
        addr <= a_qout;
     ELSIF c_invadd = '1' THEN
        addr <= a_qoutn;
     END IF;
   END PROCESS;

PROCESS(testmode, sysaddr, syswen, sysoen, syscen, sysdatain,
           addr, c_rw, testclock, c_ramdata)
   BEGIN
     IF (testmode = '1') THEN
        ramaddr <= addr;
```

```
          ramwen    <= c_rw;
          ramoen    <= NOT(c_rw);
          ramcen    <= testclock;
          ramdatain <= c_ramdata;
        ELSIF (testmode = '0') THEN
          ramaddr   <= sysaddr;
          ramwen    <= syswen;
          ramoen    <= sysoen;
          ramcen    <= syscen;
          ramdatain <= sysdatain;
        END IF;
      END PROCESS;

END synth;
```

What is claimed is:

1. A method for making a digital integrated circuit with built-in self-test comprising the steps of:

developing circuit specifications including base specifications describing base functionality and built-in self-test (BIST) specifications describing BIST functionality for a digital integrated circuit (IC);

describing said base specifications in a hardware description language (HDL) to create a base HDL and inputting said base HDL into a digital computer system;

creating on said digital computer system a BIST HDL utilizing both said base specifications and said BIST specifications;

synthesizing on said digital computer system a netlist derived from both said basic circuit HDL and said BIST HDL which specifies circuitry of said IC that includes both said base functionality and said BIST functionality; and producing an IC as specified by said netlist comprising a semiconductor die including said circuitry of said IC, said semiconductor die having a plurality of I/O pads, a package enclosing said integrated circuit die, a plurality of leads extending from said package, and a plurality of conductors coupling said plurality of I/O pads of said semiconductor die to said plurality of leads.

2. A method as recited in claim 1 further comprising the steps of:

laying out on said digital computer system at least portions of said circuitry to produce an IC layout; and producing at least one integrated circuit mask based upon said IC layout;

wherein said integrated circuit is produced, at least in part, with said at least one integrated circuit mask.

3. A method as recited in claim 2 wherein said step of laying out comprises laying out at least portions of said circuitry for a gate array circuit.

4. A method as recited in claim 2 wherein said step of laying out comprises laying out at least portions of said circuitry for a standard cell circuit.

5. A method as recited in claim 1 further comprising a step of combining said base HDL and said BIST HDL prior to said synthesizing step.

6. A method as recited in claim 1 wherein said synthesizing step separately synthesizes a base netlist and a BIST netlist, and further comprising a step of combining said base netlist and said BIST netlist after said synthesizing step.

7. A method as recited in claim 1 wherein said step of developing BIST specifications comprises the steps of:

receiving BIST user preference information;

receiving testable circuit information; and storing on said computer system BIST specifications including said BIST user preference information and testable circuit information.

8. A method as recited in claim 7 wherein said steps of receiving BIST user preference information and receiving testable circuit information utilize a menu interface presented to a user on a screen of said computer system.

9. A method as recited in claim 7 wherein said step of creating a BIST HDL further comprises the step of determining a type of BIST using said BIST user preference information.

10. A method as recited in claim 9 wherein said step of creating a BIST HDL further comprises the step of determining the types of sub-blocks required for said type of BIST.

11. A method as recited in claim 10 wherein said step of creating a BIST HDL further comprises the step of determining the identity of said sub-blocks utilizing said testable circuit information.

12. A method as recited in claim 11 wherein said step of creating a BIST HDL further comprises the step of customizing at least one sub-block based upon both said BIST user preference information and said testable circuit information.

13. A method as recited in claim 12 wherein said step of creating a BIST HDL further comprises the step of connecting said sub-blocks into said BIST HDL.

14. A method for creating on a computer system an HDL description of BIST circuitry of an IC including both base circuitry and BIST circuitry, said method comprising the steps of:

developing circuit specifications including base specifications describing base functionality and BIST specifications describing BIST functionality for an IC; and creating on a digital computer system a BIST HDL utilizing both said base specifications and said BIST specifications.

15. A method as recited in claim 14 wherein said step of developing BIST specifications comprises the steps of:

receiving BIST user preference information;

receiving testable circuit information; and storing on said computer system BIST specifications including said BIST user preference information and testable circuit information.

16. A method as recited in claim 15 wherein said steps of receiving BIST user preference information and receiving testable circuit information utilize a menu interface presented to a user on a screen of said computer system.

17. A method as recited in claim 15 wherein stud step of creating a BIST HDL further comprises the step of determining a type of BIST using said BIST user preference information.

18. A method as recited in claim 17 wherein said step of creating a BIST HDL further comprises the step of determining the types of sub-blocks required for said type of BIST.

19. A method as recited in claim 18 wherein said step of creating a BIST HDL further comprises the step of determining the identity of said sub-blocks utilizing said testable circuit information.

20. A method as recited in claim 19 wherein said step of creating a BIST HDL further comprises the step of customizing at least one sub-block based upon both said BIST user preference information and said testable circuit information.

21. A method as recited in claim 20 wherein said step of creating a BIST HDL further comprises the step of connecting said sub-blocks into said BIST HDL.

22. A system for creating integrated circuit masks comprising:

a digital hardware description processor including a central processing unit (CPU), digital storage coupled to said CPU, and a user input device coupled to said CPU, said hardware description processor being operative to create mask generation data from circuit specifications for a digital integrated circuit received, at least in part, from said user input device, said circuit specifications including both base specifications describing base functionality and built-in self-test (BIST) specifications describing BIST functionality, where said base specifications are expressed in a base HDL and said BIST specifications are expressed in a BIST HDL, said hardware description processor developing said mask generation data in a series of steps including the step of generating an IC netlist from said base HDL and said BIST HDL, said BIST HDL developed at least in part from said base specifications, said hardware description processor storing said mask generation data in said digital storage; and a digital mask generator coupled to said digital storage for making at least one integrated circuit mask from said mask generation data stored in said digital storage.

23. A system as recited in claim 22 wherein said user input device of said digital hardware description processor includes a monitor which presents a menu interface to a user.

24. A system as recited in claim 22 wherein said base HDL expressing said base specifications is stored, at least in part, on said digital storage of said hardware description processor.

25. A system as recited in claim 22 wherein said BIST HDL expressing said BIST specifications are stored, at least in part, on said digital storage of said hardware description processor.

26. A system as recited in claim 22 wherein said hardware description processor comprises a synthesizer for producing said netlist.

27. A system as recited in claim 26 wherein said synthesizer includes a BIST type recognizer for recognizing the BIST type based upon said BIST specifications.

28. A system as recited in claim 27 wherein said synthesizer includes a sub-block classifier for determining the types of sub-blocks required for said BIST type.

29. A system as recited in claim 28 wherein said synthesizer includes a sub-block selector which utilizes said base circuit specifications to select said sub-blocks from a plurality of sub-blocks.

30. A system as recited in claim 29 wherein said synthesizer includes a customizer which customizes at least one of said sub-block based upon both said base specifications and said BIST specifications.

31. A system as recited in claim 30 wherein said synthesizer includes a BIST insertion module for inserting a BIST netlist derived from said BIST HDL into a base netlist derived from said base HDL to form said IC netlist.

32. Software stored in a digital form to run on a digital computer to create an HDL description of BIST circuitry, said software comprising:

a user interface generator to generate a user interface to receive BIST user preference information and testable circuit information;

a type analyzer for determining a type of BIST circuitry to use;

a sub-block analyzer for determining what types of sub-blocks may be required;

a sub-block identifier for determining the identity of said sub-block types;

a sub-block customizer for customizing sub-blocks requiring customization; and a combiner for combining said sub-blocks to create a description of a BIST controller in an HDL.

33. Software as recited in claim 32 wherein said user interface generator produces a menu on a monitor of a computer, said menu listing choices for said BIST user preference information.

34. Software as recited in claim 33 wherein said sub-block identifier retrieves a digital form of said sub-blocks from a digital storage device electrically coupled to said computer.

35. A method for creating on a computer system an HDL description of BIST circuitry of an IC including both base circuitry and BIST circuitry, said method comprising the steps of:

developing circuit specifications including base specifications describing base functionality and BIST specifications describing BIST functionality for an IC; and creating on a digital computer system a BIST HDL utilizing both said base specifications and said BIST specifications by retrieving at least one template of a BIST HDL that is stored on said computer system and modifying said template based upon said circuit specifications.

36. A method as recited in claim 35 wherein said step of retrieving at least one template includes the steps of analyzing said base specifications and said BIST specifications and selecting an appropriate template from a library of templates.

37. A method as recited in claim 36 wherein said step of modifying said template includes the steps of analyzing said base specifications and said BIST specifications and inserting appropriate parameters into said template.

* * * * *